(12) United States Patent
Kawamura et al.

(10) Patent No.: US 7,468,913 B2
(45) Date of Patent: Dec. 23, 2008

(54) SEMICONDUCTOR DEVICE

(75) Inventors: Tetsufumi Kawamura, Kokubunji (JP); Hitoshi Kume, Musahino (JP); Tsuyoshi Arigane, Akishima (JP)

(73) Assignee: Renesas Technology Corp., Tokyo (JP)

( * ) Notice: Subject to any disclaimer, the term of this patent is extended or adjusted under 35 U.S.C. 154(b) by 49 days.

(21) Appl. No.: 11/822,120

(22) Filed: Jul. 2, 2007

(65) Prior Publication Data
US 2008/0025107 A1    Jan. 31, 2008

(30) Foreign Application Priority Data
Jul. 27, 2006   (JP) ............................. 2006-204118

(51) Int. Cl.
*G11C 16/00* (2006.01)
(52) U.S. Cl. ............................. 365/185.18; 365/185.26; 365/185.28
(58) Field of Classification Search ............. 365/185.05
See application file for complete search history.

(56) References Cited

U.S. PATENT DOCUMENTS

| | | | | |
|---|---|---|---|---|
| 4,964,080 | A * | 10/1990 | Tzeng ................... | 365/185.01 |
| 5,350,937 | A * | 9/1994 | Yamazaki et al. ........... | 257/316 |
| 6,005,807 | A * | 12/1999 | Chen ..................... | 365/185.26 |
| 6,438,028 | B1 | 8/2002 | Kobayashi et al. | |
| 6,972,997 | B2 | 12/2005 | Ishimaru et al. | |
| 7,317,634 | B2 * | 1/2008 | Kawamura et al. ..... | 365/185.14 |
| 2002/0118569 | A1 | 8/2002 | Jeong et al. | |
| 2004/0084714 | A1 | 5/2004 | Ishii et al. | |
| 2004/0129986 | A1 | 7/2004 | Kobayshi et al. | |
| 2005/0141281 | A1 | 6/2005 | Jung | |

FOREIGN PATENT DOCUMENTS

| | | |
|---|---|---|
| JP | 2002-245785 A | 8/2002 |
| JP | 2004-152977 A | 5/2004 |
| JP | 2005-197683 A | 7/2005 |

* cited by examiner

*Primary Examiner*—Tan T. Nguyen
(74) *Attorney, Agent, or Firm*—Miles & Stockbridge P.C.

(57) ABSTRACT

A highly-reliable semiconductor device is realized. For example, each memory cell of a nonvolatile memory included in the semiconductor device is configured to include a source and a drain formed in a P-well, a memory node which is formed on the P-well between the source and the drain via a tunnel insulator and is insulated from its periphery, and a control gate formed on the memory node via an interlayer insulator. When a programming operation using channel hot electrons is to be performed in such a configuration, the P-well is put into an electrically floating state.

11 Claims, 21 Drawing Sheets

| PROGRAM | |
|---|---|
| SELECTED CGL | 15 V |
| UNSELECTED CGL | 0 V |
| SOL | 0 V |
| SELECTED BL | 5 V |
| UNSELECTED BL | 0 V |
| PW | FLOATING |

| | PW (P-type Well) | | | |
|---|---|---|---|---|
| | (a) | (b) | (c) | (d) |
| PROGRAM | FLOATING | FLOATING | FLOATING | FLOATING |
| ERASE | VPWerase | VPWerase | FLOATING | FLOATING |
| READ | VPWread | FLOATING | VPWread | FLOATING |

| PROGRAM | |
|---|---|
| SELECTED CGL | 15 V |
| UNSELECTED CGL | 0 V |
| DRL | 5 V |
| SELECTED BL | 0 V |
| UNSELECTED BL | 5 V |
| PW | FLOATING |

| PROGRAM | |
|---|---|
| SELECTED CGL | 15 V |
| UNSELECTED CGL | 0 V |
| SELECTED BL DRAIN | 5 V |
| SELECTED BL SOURCE | 0 V |
| UNSELECTED BL | FLOATING |
| PW | FLOATING |

| PROGRAM | |
|---|---|
| SELECTED CGL | 15 V |
| UNSELECTED CGL | 0 V |
| SELECTED SGL | ~ Vth |
| UNSELECTED SGL | 0 V |
| SOL | 0 V |
| SELECTED BL | 5 V |
| UNSELECTED BL | 0 V |
| PW | FLOATING |

| PROGRAM | |
|---|---|
| SELECTED CGL | 15 V |
| UNSELECTED CGL | 0 V |
| SELECTED SGL | ~ Vth |
| UNSELECTED SGL | 0 V |
| DRL | 5 V |
| SELECTED BL | 0 V |
| UNSELECTED BL | 5 V |
| PW | FLOATING |

| PROGRAM | |
|---|---|
| SELECTED CGL | 15 V |
| UNSELECTED CGL | 0 V |
| SELECTED SGL | ~ Vth |
| UNSELECTED SGL | |
| SELECTED BL DRAIN | 5 V |
| SELECTED BL SOURCE | 0 V |
| UNSELECTED BL | FLOATING |
| PW | FLOATING |

| PROGRAM | |
|---|---|
| SELECTED SGL | ~ Vth |
| UNSELECTED SGL | 0 V |
| SOL | 0 V |
| SELECTED BL | 10 V |
| UNSELECTED BL | 0 V |
| PW | FLOATING |

| PROGRAM | |
|---|---|
| SELECTED SGL | ~ Vth |
| UNSELECTED SGL | 0 V |
| DRL | 10 V |
| SELECTED BL | 0 V |
| UNSELECTED BL | 10 V |
| PW | FLOATING |

| PROGRAM | |
|---|---|
| SELECTED SGL | ~ Vth |
| UNSELECTED SGL | 0 V |
| DRL | 10 V |
| SELECTED BL DRAIN | 10 V |
| SELECTED BL SOURCE | 0 V |
| UNSELECTED BL | FLOATING |
| PW | FLOATING |

| PROGRAM | |
|---|---|
| SELECTED CGL | 10 V |
| UNSELECTED CGL | 0 V |
| SELECTED SGL | ~ Vth |
| UNSELECTED SGL | 0 V |
| SOL | 0 V |
| SELECTED BL | 5 V |
| UNSELECTED BL | 0 V |
| PW | FLOATING |

| PROGRAM | |
|---|---|
| SELECTED CGL | 10 V |
| UNSELECTED CGL | 0 V |
| SELECTED SGL | ~ Vth |
| UNSELECTED SGL | 0 V |
| DRL | 5 V |
| SELECTED BL | 0 V |
| UNSELECTED BL | 5 V |
| PW | FLOATING |

| PROGRAM | |
|---|---|
| SELECTED CGL | 15 V |
| UNSELECTED CGL | 0 V |
| SELECTED AG | ~ Vth |
| UNSELECTED AG | 0 V |
| SELECTED BL DRAIN | 5 V |
| SELECTED BL SOURCE | 0 V |
| BL' | FLOATING |
| PW | FLOATING |

| PROGRAM | |
|---|---|
| SELECTED CGL | 15 V |
| UNSELECTED CGL | 0 V |
| SELECTED SG | ~ Vth |
| UNSELECTED SG | 0 V |
| SELECTED BL DRAIN | 5 V |
| SELECTED BL SOURCE | 0 V |
| PW | FLOATING |

SEMICONDUCTOR DEVICE

CROSS-REFERENCE TO RELATED APPLICATION

The present application claims priority from Japanese Patent Application No. JP 2006-204118 filed on Jul. 27, 2006, the content of which is hereby incorporated by reference into this application.

TECHNICAL FIELD OF THE INVENTION

The present invention relates to a semiconductor device. More particularly, it relates to a technology effective for improving the reliability of a semiconductor device including an electrically programmable and erasable nonvolatile memory.

BACKGROUND OF THE INVENTION

Of the electrically programmable and erasable nonvolatile memories, a flash memory is known as the bulk erasable one. The flash memory is excellent in portability and impact resistance, and can be electrically erased in bulk. Therefore, its demand as a memory device for small portable information devices has been rapidly expanding in recent years. Reduction of bit cost, increase of operation speed, and improvement in reliability have been required for the flash memories so that high density data can be safely handled at a high speed.

In some flash memories such as NOR-type and AND-type flash memories, reduction in bit cost is achieved by the technologies for the device structures and the scaling down and the adoption of the multi-bit storage, and further, high-speed programming is achieved by a channel hot electron injection method.

For example, in Japanese Patent Application Laid-Open Publication No. 2004-152977 (Patent Document 1), a technology for achieving both the reduction in bit cost and the high-speed programming is described. In this case, small-area memory cells are realized by forming the bit lines in a memory cell from inversion layers, and high-speed programming is realized by adopting a source-side channel hot electron injection method.

SUMMARY OF THE INVENTION

However, although the bit cost is reduced when the density is increased by the scaling down and the multi-bit storage, data destruction readily occurs. In particular, when the above-mentioned channel hot electron injection (hereinafter, abbreviated as CHE injection) programming is performed, data destruction due to hot holes which are generated at the same time is problematic.

This will be described in detail with reference to FIG. 1 and FIG. 2. FIG. 1 is a cross sectional view taken along the line A-A' of FIG. 2. In the CHE injection programming, 0 V, about 15 V, 0 V, and about 5 V are applied to a P well (PW), a control gate (CG), a source (SO), and a drain (DR) of FIG. 1, respectively. By this means, hot electrons are generated in the channel and injected into a memory node (MN). This is equivalent to applying about 15 V, 0 V, and about 5 V to a selected control gate line (CGL2), a source line (SOL), and a selected bit line (BL1) in FIG. 2, respectively. At this time, about 0 V is applied to unselected control gate lines and unselected bit lines so that programming does not occur on unselected cells. As a result, in some of the unselected cells (unselected cells on BL1), about 5 V is applied to the drain (DR) and about 0 V is applied to the control gate (CG).

Under such voltage conditions, hot holes generated by interband tunneling in the pn junction between the p-type P well (PW) and the n-type drain (DR) are injected into the memory node (MN) which is at a low voltage, and data destruction occurs. This data destruction mode is called "drain disturbance", and this is a large problem in performing the CHE injection. Further, the steeper the impurity distribution of the pn junction by the scaling down or the smaller the margin of a threshold voltage (hereinafter, abbreviated as Vth) window when multi-bit storage is performed, the more serious the drain disturbance becomes. When CHE injection is to be adopted, the drain disturbance has to be suppressed.

Therefore, an object of the present invention is to provide a technology for suppressing the drain disturbance to improve the reliability of a semiconductor device. The above and other objects and novel characteristics of the present invention will be apparent from the description of this specification and the appended drawings.

The typical ones of the inventions disclosed in this application will be briefly described as follows.

A semiconductor device of the present invention includes a plurality of memory cells, and each of the memory cells includes: first and second diffusion layers formed in a semiconductor well of a first conductivity type and exhibiting a second conductivity type; a memory node formed on the well between the first diffusion layer and the second diffusion layer via a first insulator and insulated from the periphery thereof; and a first electrode formed on the memory node via a second insulator. In such a configuration, when a programming operation in which the energy of a part of the carriers flowing between the first diffusion layer and the second diffusion layer is increased and then injected into the memory node is to be performed, the semiconductor well is put into an electrically floating state, which is a feature of the present invention. In this manner, drain disturbance in unselected memory cells can be reduced, and the highly reliable semiconductor device can be realized.

The effects obtained by typical aspects of the present invention will be briefly described below. That is, the highly reliable semiconductor device can be realized.

BRIEF DESCRIPTIONS OF THE DRAWINGS

Figures 37, 38:
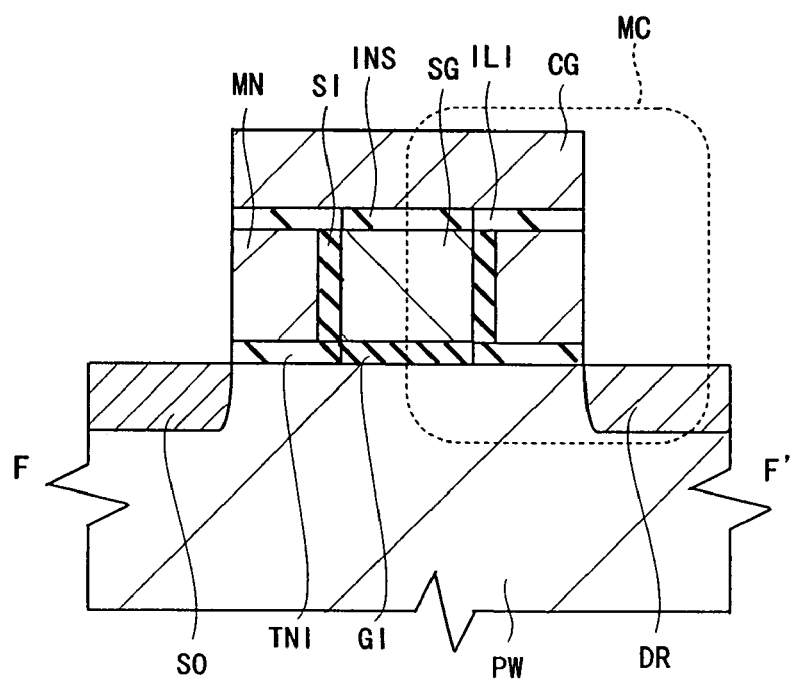
FIG. 37 is an explanatory diagram showing an example of programming conditions in the configuration of FIG. 35 and FIG. 36.
FIG. 38 is a cross sectional view showing a principal part of a structure example of each memory cell included in a semiconductor device according to a thirteenth embodiment of the present invention.
Figures 39, 40:
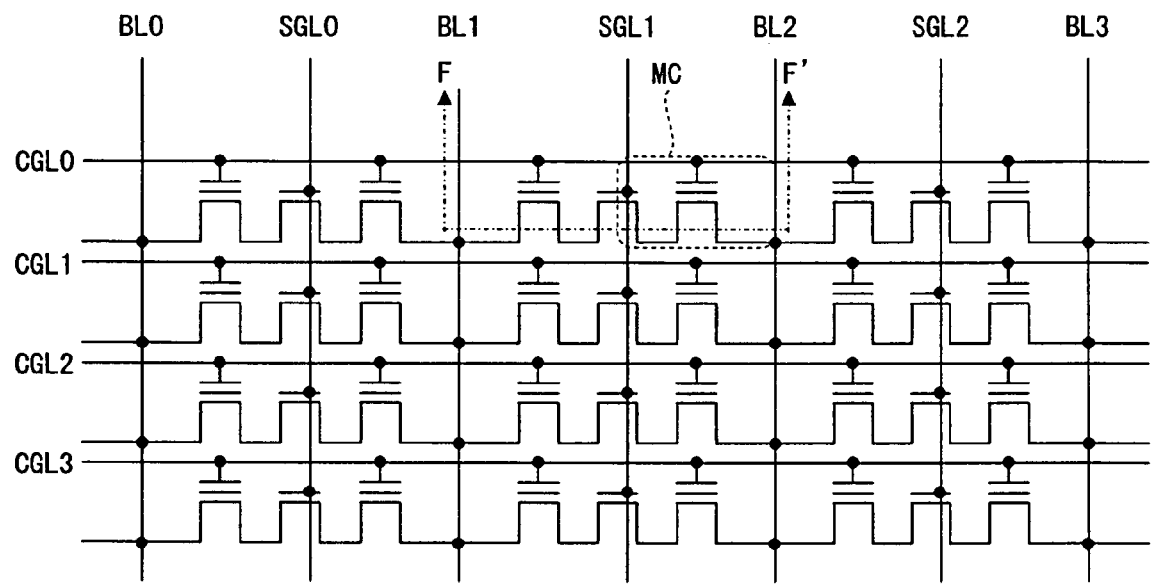
FIG. 39 is an equivalent circuit diagram showing a configuration example of a memory array included in the semiconductor device according to the thirteenth embodiment of the present invention.
Figure 41:
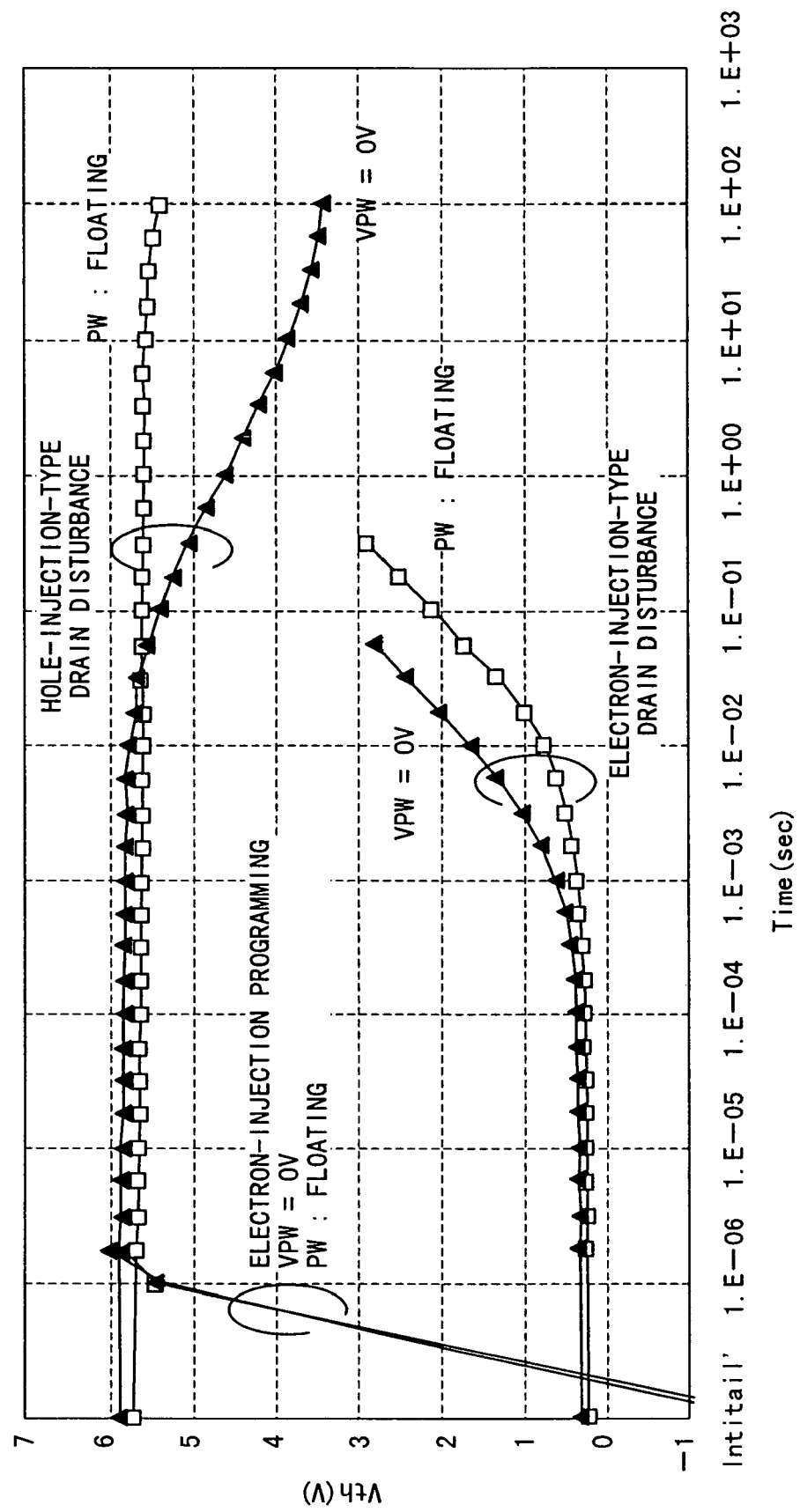

FIG. 40 is an explanatory diagram showing an example of programming conditions in the configuration of FIG. 38 and FIG. 39; and FIG. 41 is a graph showing effects of drain disturbance suppression for the nonvolatile memory included in the semiconductor device according to the present invention which is acquired by using the nonvolatile memory included in the semiconductor device according to an eleventh embodiment of the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A semiconductor device of the present embodiment includes an electrically programmable and erasable nonvolatile memory such as a flash memory, wherein, for example, the nonvolatile memory is independently formed on a semiconductor substrate or formed together with a logic circuit such as a processor on a semiconductor substrate. Characteristics of the present embodiment lie in the part of the nonvolatile memory in the semiconductor device. Details of the nonvolatile memory will be described below with reference to FIG. 1 to FIG. 10.

Figure 1:
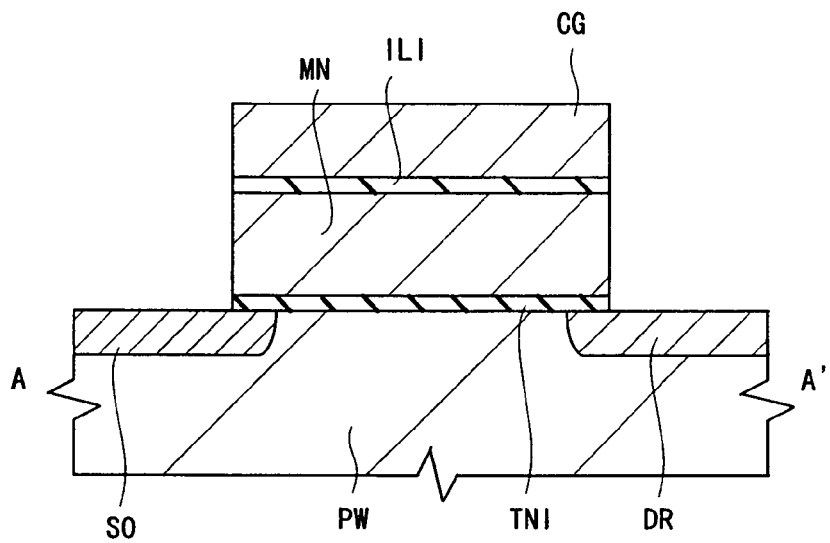
FIG. 1 is a cross sectional view showing a principal part of a structure example of each memory cell included in a semiconductor device according to a first embodiment of the present invention.

FIG. 1 is a cross sectional view showing a principal part of a structure example of each memory cell included in the semiconductor device according to the first embodiment of the present invention. In FIG. 1, a source (SO) and a drain (DR) are formed by n-type impurity implantation in a P-well (PW) formed on the semiconductor substrate. In addition, a memory node (MN) is formed on the P-well (PW) via a tunnel insulator (TNI). Further, a control gate (CG) is formed on the memory node (MN) via an interlayer insulator (ILI). The memory node (MN) is insulated from the periphery thereof and is in a floating state.

The semiconductor substrate and the P-well are made of, for example, single crystal silicon and the tunnel insulator (TNI) and the interlayer insulator (ILI) are formed of, for example, silicon oxide films. Further, the memory node (MN) is made of, for example, n-type polysilicon, silicon fine particles, silicon nitride, or the like, and the control gate (CG) is formed of, for example, a stacked structure of n-type polysilicon and tungsten.

Figure 2:
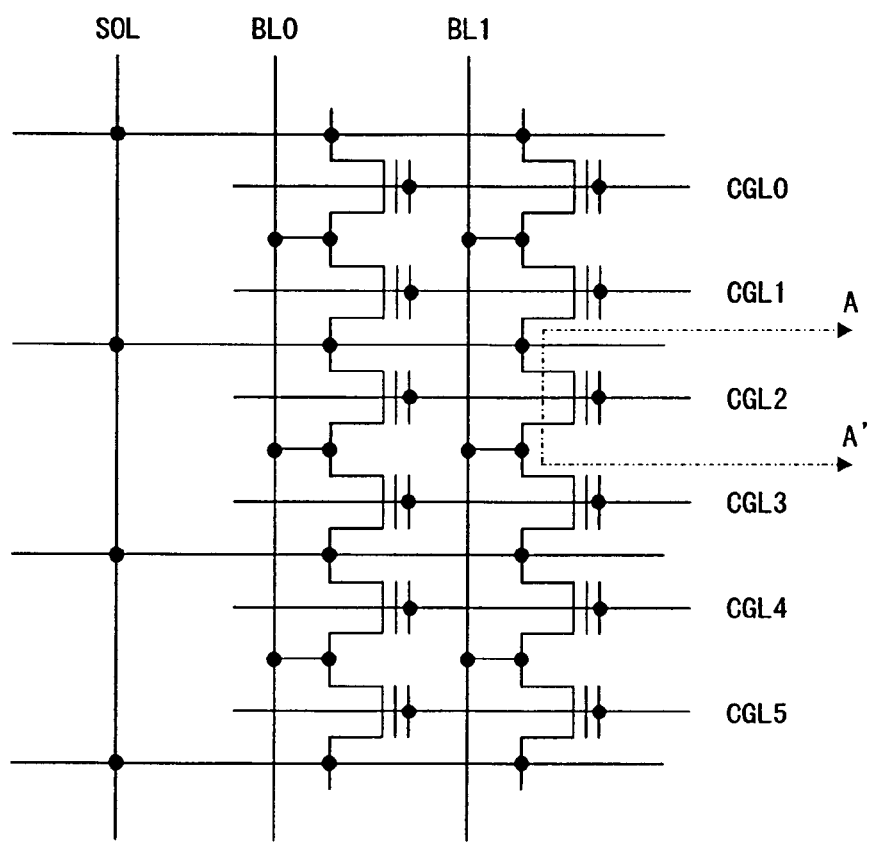
FIG. 2 is an equivalent circuit diagram showing a configuration example of a memory array included in the semiconductor device according to the first embodiment of the present invention.

FIG. 2 is an equivalent circuit diagram showing a configuration example of a memory cell included in the semiconductor device according to the first embodiment of the present invention. The cross section indicated by a chain line A-A' corresponds to above-described FIG. 1.

In FIG. 2, control gate lines (CGL) extend in the horizontal direction of the memory array. Source lines (SOL) extend in the horizontal direction of the memory array and coupled into one line at an end of the array. Also, bit lines (BL) extend in the vertical direction of the memory array. For example, the control gate (CG) of FIG. 1 also functions as the control gate line (CGL), and the source (SO) of FIG. 1 also functions as the part of the source lines (SOL) extending in the horizontal direction. The part of the source lines (SOL) extending in the vertical direction and the bit lines (BL) are formed of, for example, metal wires. The bit line is electrically coupled with the drain (DR) of FIG. 1.

Figures 3, 4:
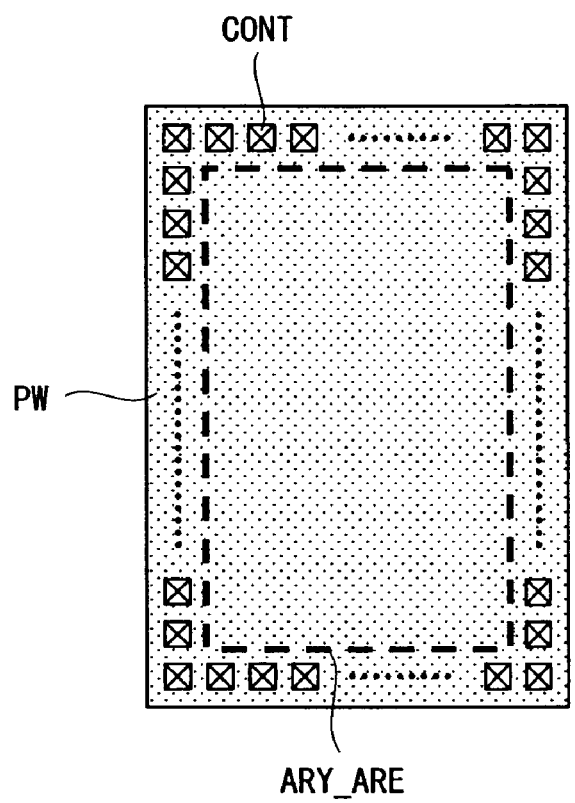
FIG. 3 is a schematic diagram showing a layout configuration example of the memory array of FIG. 2.
FIG. 4 is an explanatory diagram showing an example of programming conditions in the configuration of FIG. 1 and FIG. 2.

FIG. 3 is a schematic diagram showing a layout configuration example of the memory array of FIG. 2. In FIG. 3, a memory array area (ARY_ARE) in which memory cells as shown in FIG. 1 are arranged in a matrix is formed on the P-well (PW). On the P-well, contacts (CONT) are formed so as to surround the periphery of the memory array, and voltages can be applied to PW.

Next, the operation of the memory will be described.

Programming is performed by CHE injection. FIG. 4 is an explanatory diagram showing an example of programming conditions in the configuration of FIG. 1 and FIG. 2. In the programming, as shown in FIG. 4, voltages of about 15 V, 0 V, and about 5 V are applied to the control gate (CG), the source (SO), and the drain (DR), respectively. By this means, hot electrons are generated in the vicinity of the drain of the channel and injected into the memory node (MN). This is equivalent to applying about 15 V, 0 V, and about 5 V to the selected control gate line (CGL2), the source line (SOL), and the selected bit line (BL1) of FIG. 2, respectively.

Erasing is performed by F-N tunnel ejection from the memory node (MN) to the control gate (CG) or the P-well (PW) or by the hot hole injection to the memory node (MN). Also, reading is performed by detecting Vth change of a memory cell transistor by utilizing the channel current that flows between the source (SO) and the drain (DR).

In such memory operations, in the CHE programming described above, about 0 V is applied to the unselected control gate lines and unselected bit lines of FIG. 2 so that programming to unselected cells does not occur. As a result, in some of the unselected cells (unselected cells on BL1), about 5 V is applied to the drain (DR), and about 0 V is applied to the control gate (CG). Under such voltage conditions, in the pn junction between the p-type P-well (PW) and the n-type drain (DR), hot holes generated by interband tunneling are injected into the memory node (MN) which is at a low voltage, and the drain disturbance occurs.

Therefore, the first embodiment is characterized by putting the P-well (PW) at the CHE injection into a floating state in order to suppress the drain disturbance. The generation of hot holes due to interband tunneling largely depends on the voltage between the P-well (PW) and the drain (DR), and the larger the voltage is, the more readily the hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Figure 5:
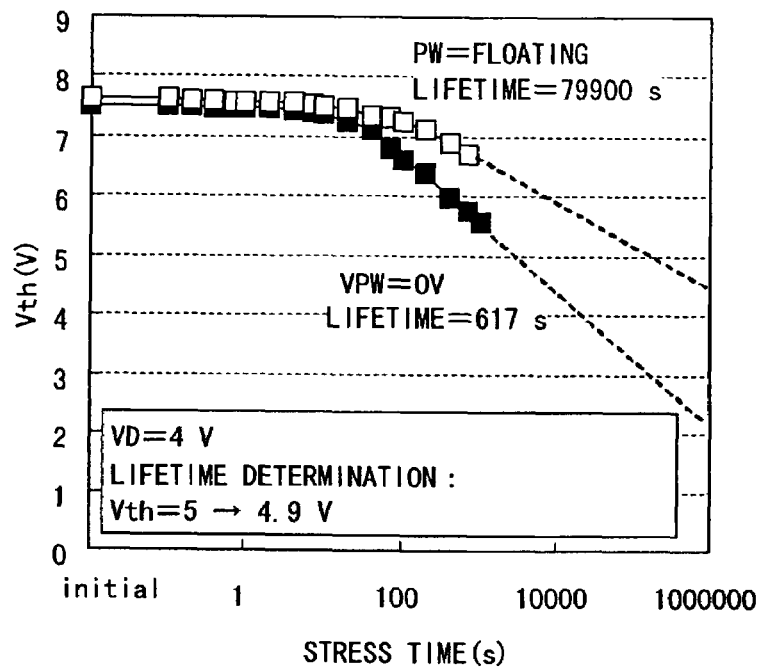
FIG. 5 is a graph showing effects of drain disturbance suppression for the nonvolatile memory included in the semiconductor device according to the first embodiment of the present invention.

This will be described with reference to the data of FIG. 5. In FIG. 5, after programming is performed until Vth of the memory cell becomes about 7.5 V, a voltage stress by which drain disturbance is caused is applied, and stress time dependency of Vth is observed. The case where the P-well voltage (VPW) is 0 V is represented by black squares, and the case where the P-well is in a floating state is represented by white squares. When the time until Vth is reduced from 5 V to 4.9 V is defined as lifetime, the lifetime is 617 s in the case where the P-well voltage (VPW) is 0 V, and on the other hand, the lifetime is 79900 s in the case where the P-well is in a floating state. That is, the lifetime is increased by more than two orders of magnitude.

Figure 6:
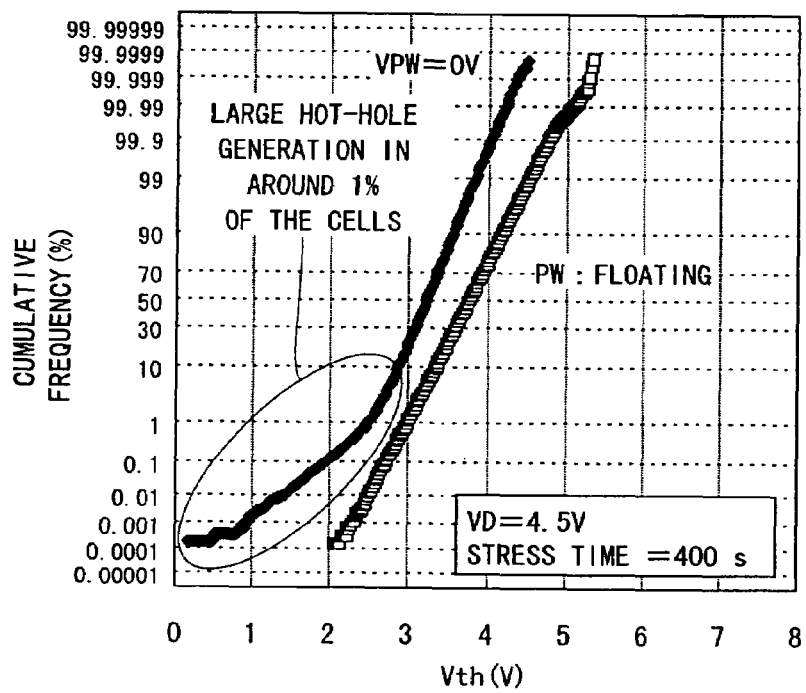
FIG. 6 is a graph showing effects of drain disturbance suppression for the nonvolatile memory included in the semiconductor device according to the first embodiment of the present invention.

FIG. 6 shows the effect of the above-described drain disturbance suppression confirmed by using many memory cells. After programming is performed, the voltage stress by which the drain disturbance is caused is applied for 400 s, and Vth is read. Similar to FIG. 5, the case where the P-well voltage (VPW) is 0 V is represented by black squares, and the case where the P-well is in a floating state is represented by white squares. When the P-well is in a floating state, Vth reduction in the whole distribution is reduced, and extremely large Vth reduction observed in about 1% of the cells is suppressed. The reason why extremely large Vth reduction is observed in about 1% of the cells when the P-well voltage (VPW) is 0 V is probably that generation of hot holes is increased due to crystal defects in the silicon substrate. This is likely because, when the voltage between the P-well and the drain (DR) is reduced by putting the P-well into a floating state, the electric field applied to the crystal defects is decreased and the hot hole injection is suppressed.

Figures 7, 8:
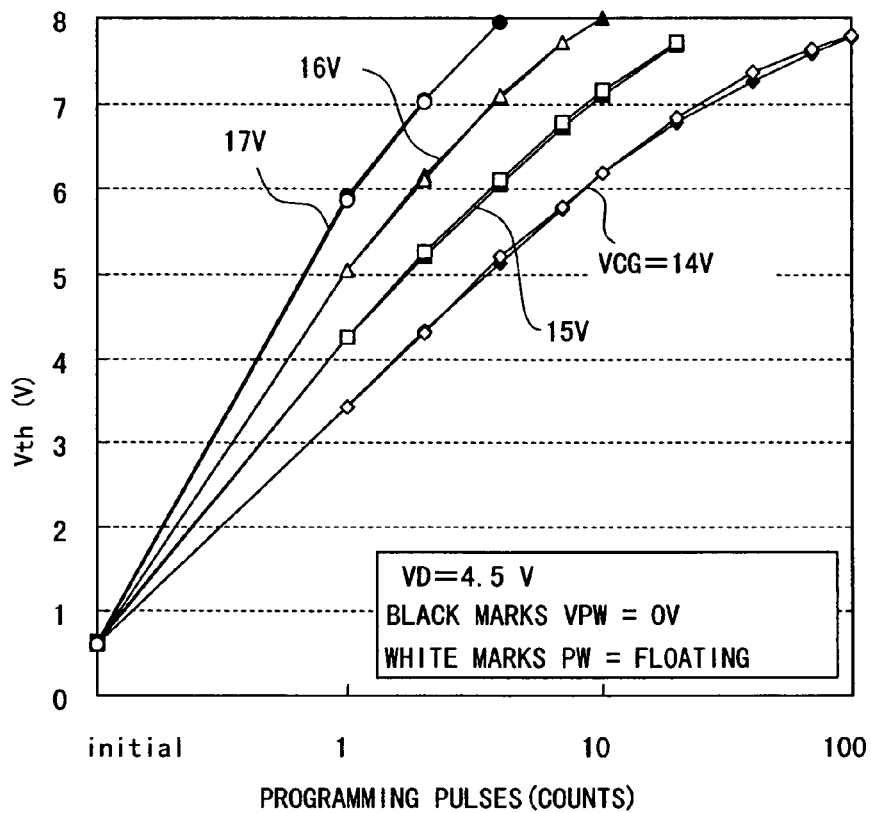
FIG. 7 is a graph showing programming characteristics of the nonvolatile memory included in the semiconductor device according to the first embodiment of the present invention.
FIG. 8 is a table showing the state of a P-well in programming, erasing, and reading in the semiconductor device according to the first embodiment of the present invention.

Effects of the first embodiment have been described in FIG. 5 and FIG. 6, and FIG. 7 shows that CHE injection programming is not deteriorated even when the P-well is put into a floating state. FIG. 7 shows the dependency of Vth change on the number of programming pulses. The case where the P-well voltage (VPW) is 0 V is represented by black squares, and the case where the P-well is in a floating state is represented by white squares. In any of the cases where the control gate voltage (VCG) is 14 V, 15 V, 16 V, or 17 V, difference in the programming characteristics is not found therebetween. This is likely because the control gate (CG) and the memory node (MN) are at a high voltage in the selected cell, and a channel inversion layer is formed regardless of the state of the P-well (PW). In other words, this is because the potential distribution between the source (SO) and the drain (DR), the amount of current, and others are not dependent on the state of the P-well (PW) in the selected cell.

As described above, in the semiconductor device according to the first embodiment, by putting the P-well (PW) into a floating state, the voltage between the P-well (PW) and the drain (DR) is reduced in the unselected cells where the drain disturbance occurs, and generation of hot holes and injection thereof into the memory node (MN) can be suppressed. On the other hand, in the selected cell, since the channel inversion layer is formed, the potential distribution, the amount of current and others between the source (SO) and the drain (DR) are not dependent on the state of the P-well (PW), and CHE injection programming is not deteriorated.

Figure 9:
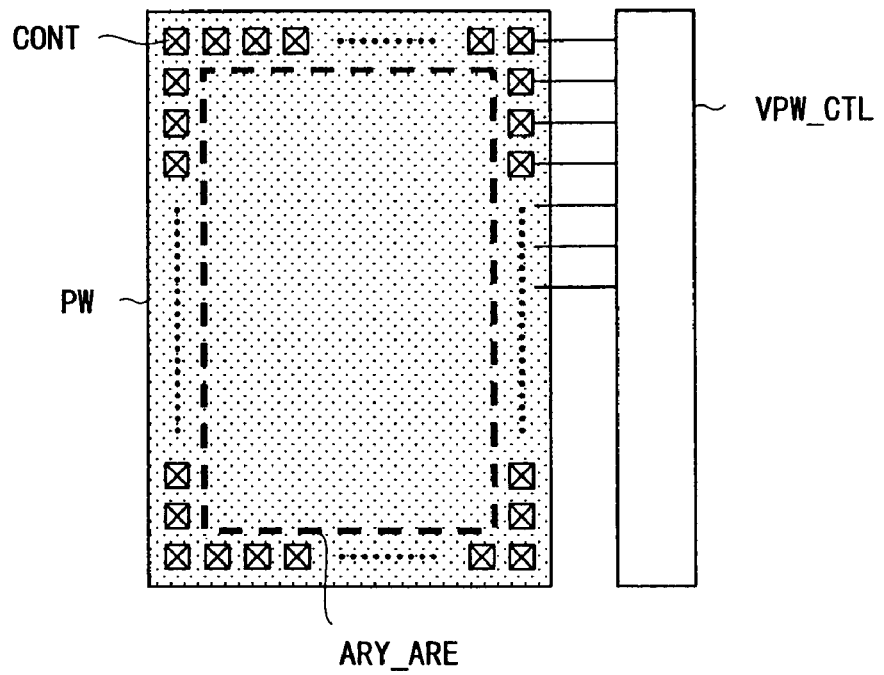
FIG. 9 is a schematic diagram showing another layout configuration example of the memory array of FIG. 2.
Figure 10:
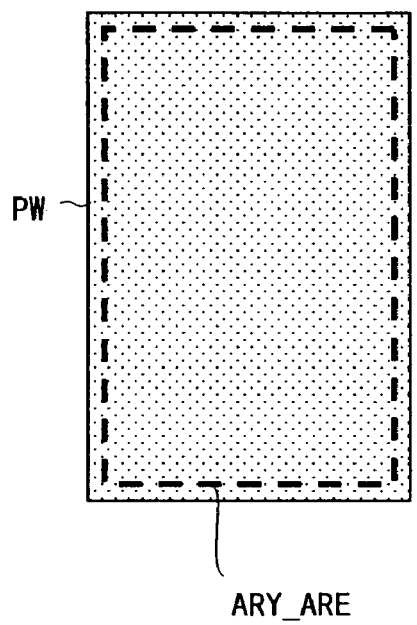
FIG. 10 is a schematic diagram showing another layout configuration example of the memory array of FIG. 2.

At the erasing and reading, the P-well (PW) may be put into a floating state or may be applied with a predetermined voltage. There are four combinations of the states of the P-well (PW) in programming, erasing, and reading as shown in conditions (a) to (d) of FIG. 8. It is desired that the P-well (PW) in standby is put into the same state as that in reading because it is suitable for the high-speed operation. However, other states are also possible. In order to control the switching of the P-well (PW) between a floating state and a predetermined voltage, a PW voltage control circuit (VPW_CTL) is connected to the contacts (CONT) as shown in FIG. 9.

In the case of the condition (d) in which the P-well (PW) is always put into a floating state, the contacts (CONT) in the periphery of the P-well (PW) and the PW voltage control circuit (VPW_CTL) can be omitted. When the high-speed reading operation is particularly required for on-chip use or the like, the condition (a) or (c) in which the P-well (PW) in reading is at a predetermined voltage is desirable. When the reduction of bit cost is particularly required for high-density data recording or the like, the condition (d) in which the chip area can be reduced by omitting the contacts (CONT) in the periphery of the P-well (PW) and the PW voltage control circuit (VPW_CTL) is desirable. Further, when the high-speed programming operation is particularly required, the condition (b) or (d) in which the states of the P-well (PW) in programming and reading are the same is desirable because verify operation can be performed at a high speed.

The materials of each component in the present embodiment and all other embodiments of the present invention are not limited to the examples described in this specification, and various modifications can be made without departing from the scope of the invention. In the present embodiment and all other embodiments of the present invention, injecting electrons into the memory node (MN) is referred to as programming, and ejecting electrons from the memory node (MN) or injecting holes into the memory node (MN) is referred to as erasing. However, they can be referred to in a reverse way. Further, although the description has been made with using an NMOS-type flash memory having a p-type well as an example, it is also possible to use a PMOS-type flash memory having an n-type well. In this case, the positive and negative of the voltages and carries have to be appropriately changed.

Second Embodiment

A semiconductor device of a second embodiment of the present invention will be described with reference to FIG. 11 and FIG. 12. The semiconductor device of the second embodiment is different from that of the first embodiment in the memory array configuration of the nonvolatile memory included therein.

Figures 11, 12:
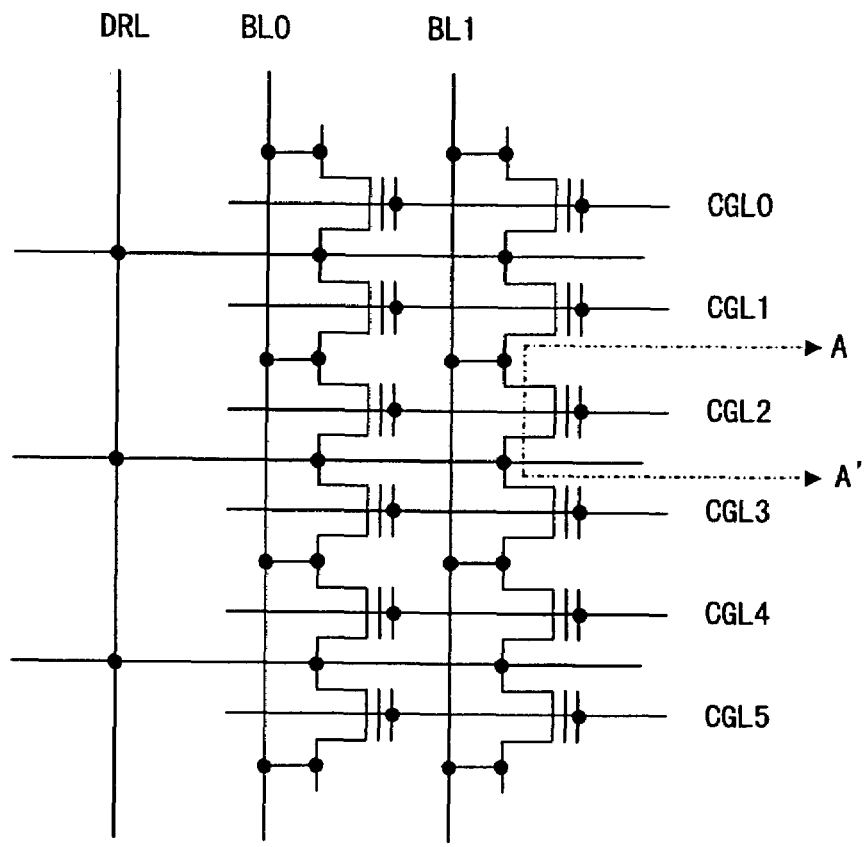
FIG. 11 is an equivalent circuit diagram showing a configuration example of a memory array included in a semiconductor device according to a second embodiment of the present invention.
FIG. 12 is an explanatory diagram showing an example of programming conditions in the configuration of FIG. 11.

FIG. 11 is an equivalent circuit diagram showing a configuration example of the memory array included in the semiconductor device according to the second embodiment of the present invention. The cross section indicated by a chain line A-A' in FIG. 11 corresponds to above-described FIG. 1. In the above-described first embodiment, the source lines (SOL) extend in the horizontal direction of the memory array and coupled into one line at the end of the array. However, in the second embodiment, drain lines (DRL) extend in the horizontal direction of the memory array and coupled into one line at the end of the array. For example, the drain (DR) of FIG. 1 also functions as the part of the drain lines (DRL) extending in the horizontal direction. The part of the drain lines (DRL) extending in the vertical direction and the bit lines (BL) are formed of, for example, metal wires. The bit line is electrically coupled with the source (SO) of FIG. 1.

Because of the differences in the array configuration, the way to apply voltages in programming also differs as shown in FIG. 4 and FIG. 12. In the above-described first embodiment, about 0 V is applied to the source lines (SOL) and the unselected bit lines, and about 5 V is applied to the selected bit line as shown in FIG. 4. In the second embodiment, however, about 5 V is applied to the drain lines (DRL) and the unselected bit lines, and about 0 V is applied to the selected bit line as shown in FIG. 12.

The semiconductor device of the second embodiment is the same as that of the first embodiment except for the differences described above.

The second embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Third Embodiment

A third embodiment of the present invention will be explained with reference to FIG. 13 and FIG. 14. The semiconductor device of the third embodiment is different from that of the first embodiment in the memory array configuration of the nonvolatile memory included therein.

Figures 13, 14:
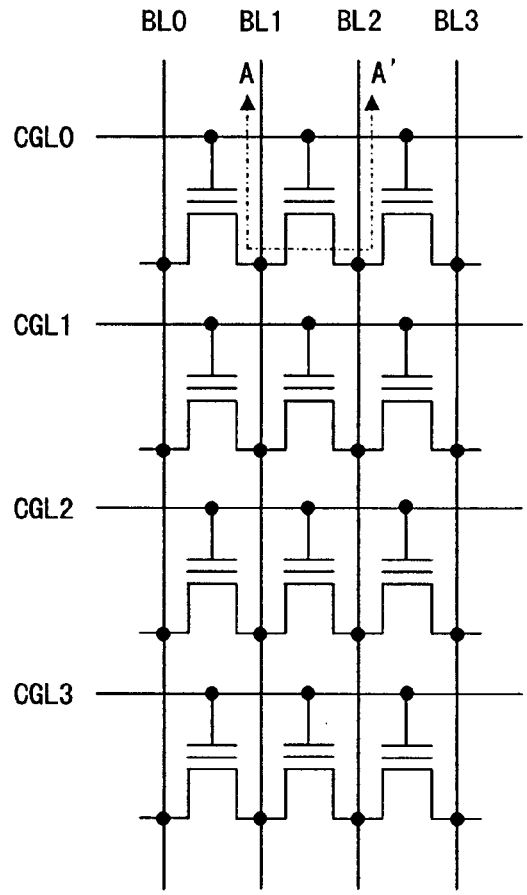
FIG. 13 is an equivalent circuit diagram showing a configuration example of a memory array included in a semiconductor device according to a third embodiment of the present invention.
FIG. 14 is an explanatory diagram showing an example of programming conditions in the configuration of FIG. 13.

FIG. 13 is an equivalent circuit diagram showing a configuration example of a memory cell included in the semiconductor device according to the third embodiment of the present invention. The cross section indicated by a chain line A-A' in FIG. 13 corresponds to above-described FIG. 1. In the above-described first embodiment, the source lines (SOL) extend in the horizontal direction of the memory array and coupled into one line at an end of the array. In the third embodiment, however, no source line is provided. Instead of that, adjacent bit lines (BL) are used as source lines. The bit lines (BL) are formed of, for example, a diffusion layer implanted with an n-type impurity and also function as the source (SO) and the drain (DR) of FIG. 1.

Because of the differences in the array configuration, the way to apply voltages in programming also differs as shown in FIG. 4 and FIG. 14. In the above-mentioned first embodiment, about 0 V is applied to the source lines (SOL) and the unselected bit lines, and about 5 V is applied to the selected bit line as shown in FIG. 4. In the third embodiment, however, about 5 V is applied to the selected bit line on the drain (DR) side, and about 0 V is applied to the selected bit line on the source (SO) side as shown in FIG. 14. The unselected bit lines are put into a state in which programming does not occur on the unselected cells, for example, a floating state.

The semiconductor device of the third embodiment is the same as the semiconductor device of the first embodiment except for the differences described above.

The third embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Fourth Embodiment

A semiconductor device of a fourth embodiment of the present invention will be described with reference to FIG. 15 to FIG. 17. The semiconductor device of the fourth embodiment is different from the first embodiment in the memory cell structure of a nonvolatile memory included therein, the array configuration, and the hot electron generation location in the CHE injection.

Figure 15:
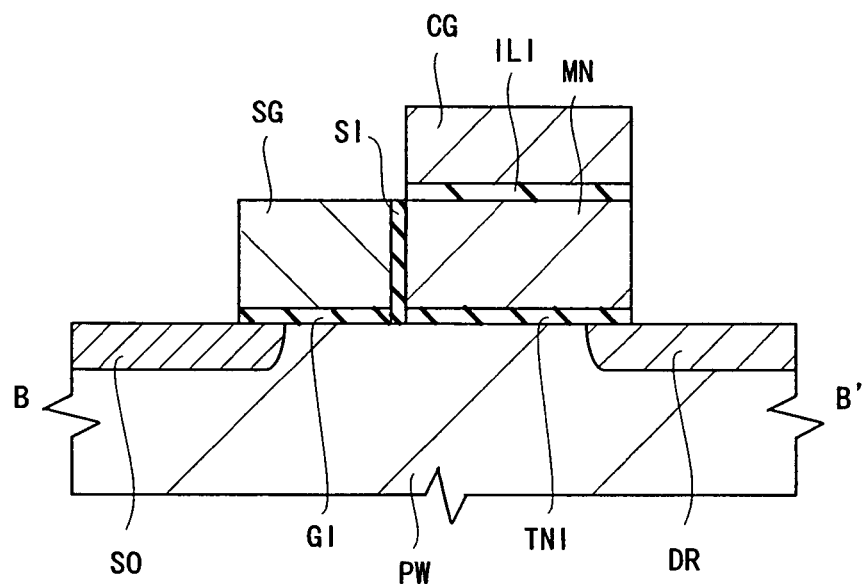
FIG. 15 is a cross sectional view showing a principal part of a structure example of each memory cell included in a semiconductor device according to a fourth embodiment of the present invention.

FIG. 15 is a cross sectional view showing a principal part of a structure example of each memory cell included in the semiconductor device according to the fourth embodiment of the present invention. In FIG. 15, a source (SO) and a drain (DR) are formed by n-type impurity implantation in a P-well (PW) formed on the semiconductor substrate. In addition, a memory node (MN) is formed on the P-well (PW) via a tunnel insulator (TNI), and a side gate (SG) is formed via a gate insulator (GI). The memory node (MN) and the side gate (SG) are insulated by a side insulator (SI). Further, on the memory node (MN), the control gate (CG) is formed via the interlayer insulator (ILI). The memory node (MN) is insulated from the periphery thereof and is in a floating state.

The semiconductor substrate and the P-well are made of, for example, single crystal silicon, and the tunnel insulator (TNI), the interlayer insulator (ILI), the gate insulator (GI), and the side insulator (SI) are formed of, for example, silicon oxide films. Further, the memory node (MN) is formed of, for example, n-type polysilicon, silicon fine particles, silicon nitride, or the like, and the side gate (SG) is made of, for example, n-type polysilicon. The control gate (CG) is formed of, for example, a stacked structure of n-type polysilicon and tungsten.

As described above, the memory cell structure of the fourth embodiment is different from that of the first embodiment in that the side gate (SG) is provided.

Figure 16:
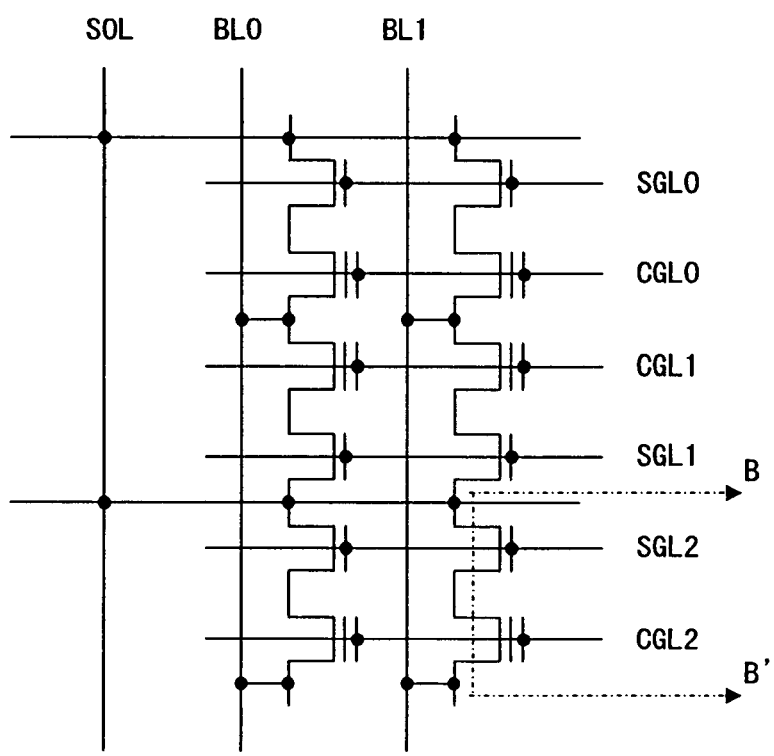
FIG. 16 is an equivalent circuit diagram showing a configuration example of a memory array included in the semiconductor device according to the fourth embodiment of the present invention.

FIG. 16 is an equivalent circuit diagram showing a configuration example of the memory array included in the semiconductor device according to the fourth embodiment of the present invention. The cross section indicated by a chain line B-B' in FIG. 16 corresponds to above-described FIG. 15. In FIG. 16, the control gate lines (CGL) and side gate lines (SGL) extend in the horizontal direction of the memory array. The source lines (SOL) extend in the horizontal direction of the memory array and coupled into one line at the end of the array. Further, the bit lines (BL) extend in the vertical direction of the memory array.

For example, the control gate (CG) also functions as the control gate line (CGL), and the side gate (SG) also functions as the side gate line (SGL). Further, the source (SO) also functions as a part of the source line (SOL) extending in the horizontal direction. The part of the source lines (SOL) extending in the vertical direction and the bit lines (BL) are formed of, for example, metal wires. The bit lines are electrically coupled with the drains (DR).

As described above, the memory array configuration of the fourth embodiment is different from that of the first embodiment in that the side gate lines (SGL) are provided.

Next, the operation of the memory will be described.

Programming is performed by the CHE injection, in particular, by a method called source side injection (SSI). FIG. 17 is an explanatory diagram showing an example of programming conditions in the configuration of FIG. 15 and FIG. 16. In programming, as shown in FIG. 17, voltages of about 15 V, about Vth, 0 V, and about 5 V are applied to the control gate (CG), the side gate (SG), the source (SO), and the drain (DR) of FIG. 15, respectively. By this means, hot electrons are generated in the channel between the region below the side gate (SG) and the region below the memory node (MN) and injected into the memory node (MN). This is equivalent to applying about 15 V, about Vth, 0 V, and about 5 V to the selected control gate line (CGL2), the selected side gate line (SGL2), the source line (SOL), and the selected bit line (BL1) of FIG. 16, respectively.

Erasing is performed by F-N tunnel ejection from the memory node (MN) to the control gate (CG), the side gate (SG), or the P-well (PW) or by hot hole injection to the memory node (MN). Reading is performed by detecting the Vth change of the memory cell transistor by utilizing the channel current that flows between the source (SO) and the drain (DR).

As described above, the memory operation in the fourth embodiment is different from that of the first embodiment in that the hot electrons are generated in the channel between the region below side gate (SG) and the region below the memory node (MN).

Figures 17, 18:
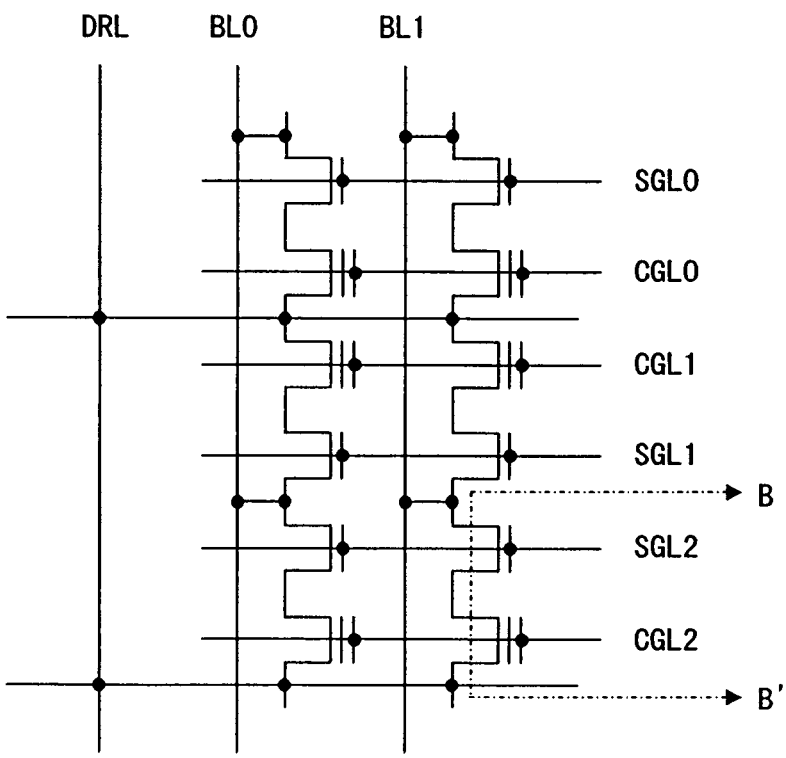
FIG. 17 is an explanatory diagram showing an example of programming conditions in the configuration of FIG. 15 and FIG. 16.
FIG. 18 is an equivalent circuit diagram showing a configuration example of a memory array included in the semiconductor device according to a fifth embodiment of the present invention.

At this time, as shown in FIG. 17, in CHE programming, about 0 V is applied to the unselected control gate lines, the unselected side gate lines, and the unselected bit lines of FIG. 16 so that programming does not occur on the unselected cells. As a result, in some of the unselected cells (unselected cells on BL1), about 5 V is applied to the drain (DR), and about 0 V is applied to the control gate (CG). Under such voltage conditions, in the pn junction between the p-type P-well (PW) and the n-type drain (DR), the hot holes generated by interband tunneling are injected into the memory node (MN) which is at a low voltage, and the drain disturbance occurs.

Therefore, the fourth embodiment is characterized in that the P-well (PW) at the CHE injection is put into a floating state in order to suppress the drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

At the erasing and reading, the P-well (PW) may be put into a floating state or may be applied with a predetermined voltage. However, when the high-speed reading operation is particularly required for on-chip use or the like, the P-well (PW) in reading is desired to be at a predetermined voltage.

The semiconductor device of the fourth embodiment is the same as that of the first embodiment except for the differences described above.

Fifth Embodiment

A semiconductor device of the fifth embodiment of the present invention will be described with reference to FIG. 18 and FIG. 19. The semiconductor device of the fifth embodiment is different from that of the fourth embodiment in the memory array configuration of the nonvolatile memory included therein.

FIG. 18 is an equivalent circuit diagram showing a configuration example of the memory array included in the semiconductor device according to the fifth embodiment of the present invention. The cross section indicated by a chain line B-B' in FIG. 18 corresponds to above-described FIG. 15. In the above-described fourth embodiment, the source lines (SOL) extend in the horizontal direction of the memory array and coupled into one line at the end of the array. In the fifth embodiment, however, the drain lines (DRL) extend in the horizontal direction of the memory array and coupled into one line at the end of the array. For example, the drain (DR) of FIG. 15 also functions as the part of the drain line (DRL) extending in the horizontal direction. The part of the drain lines (DRL) extending in the vertical direction and the bit lines (BL) are formed of, for example, metal wires. The bit line is electrically coupled with the source (SO) of FIG. 15.

Figures 19, 20:
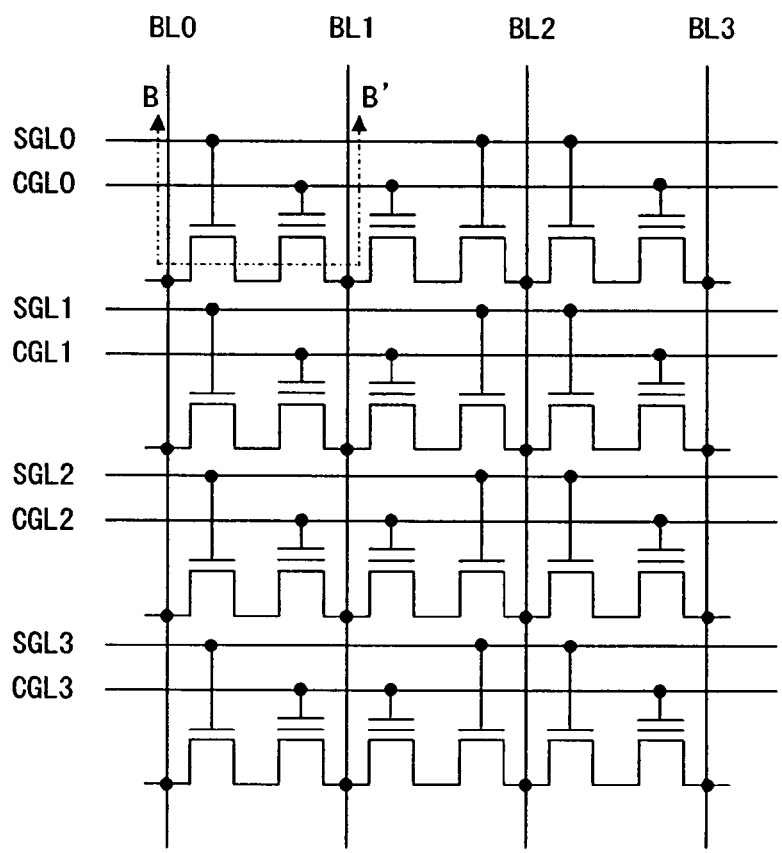
FIG. 19 is an explanatory diagram showing an example of programming conditions in the configuration of FIG. 18.
FIG. 20 is an equivalent circuit diagram showing a configuration example of a memory array included in a semiconductor device according to a sixth embodiment of the present invention.

Because of the differences in the array configuration, the way to apply voltages in programming also differs as shown in FIG. 17 and FIG. 19. In the above-described fourth embodiment, about 0 V is applied to the source lines (SOL) and the unselected bit lines, and about 5 V is applied to the selected bit line as shown in FIG. 17. In the fifth embodiment, however, about 5 V is applied to the drain line (DRL) and the unselected bit lines, and about 0 V is applied to the selected bit line as shown in FIG. 19.

The semiconductor device of the fifth embodiment is the same as that of the fourth embodiment except for the differences described above.

The fifth embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Sixth Embodiment

A semiconductor device of a sixth embodiment of the present invention will be described with reference to FIG. 20 and FIG. 21. The semiconductor device of the sixth embodiment is different from that of the fourth embodiment in the memory array configuration of the nonvolatile memory included therein.

FIG. 20 is an equivalent circuit diagram showing a configuration example of the memory array included in the semiconductor device according to the sixth embodiment of the present invention. The cross section indicated by a chain line B-B' in FIG. 20 corresponds to above-described FIG. 15. In the above-described fourth embodiment, the source lines (SOL) extend in the horizontal direction of the memory array and coupled into one line at the end of the array. However, in the sixth embodiment, no source line is provided. Instead of that, adjacent bit lines (BL) are used as source lines. The bit lines (BL) are formed of, for example, a diffusion layer implanted with an n-type impurity and also function as the source (SO) and the drain DR) of FIG. 15.

Figures 21, 22:
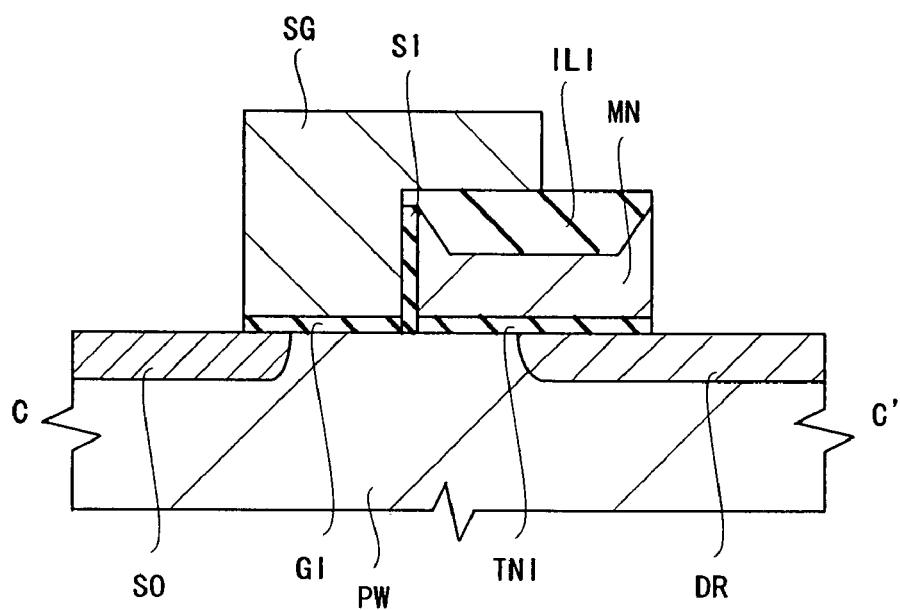
FIG. 21 is an explanatory diagram showing an example of programming conditions in the configuration of FIG. 20.
FIG. 22 is a cross sectional view showing a principal part of a structure example of each memory cell included in a semiconductor device according to a seventh embodiment of the present invention.

Because of the differences in the array configuration, the way to apply voltages in programming also differs as shown in FIG. 17 and FIG. 21. In the above-described fourth embodiment, about 0 V is applied to the source lines (SOL) and the unselected bit lines, and about 5 V is applied to the selected bit line as shown in FIG. 17. In the sixth embodiment, however, about 5 V is applied to the selected bit line on the drain (DR) side, and about 0 V is applied to the selected bit line on the source (SO) side as shown in FIG. 21. The unselected bit lines are put into a state in which programming does not occur on the unselected cells, for example, a floating state.

The semiconductor device of the sixth embodiment is the same as that of the fourth embodiment except for the differences described above.

The sixth embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Seventh Embodiment

A semiconductor device of a seventh embodiment of the present invention will be described with reference to FIG. 22 to FIG. 24. The semiconductor device of the seventh embodiment is different from that of the first embodiment in the memory cell structure of the nonvolatile memory included therein, the configuration of the memory array, and the hot electron generation location in the CHE injection.

FIG. 22 is a cross sectional view showing a principal part of a structure example of each memory cell included in the semiconductor device according to the seventh embodiment of the present invention. In FIG. 22, in the P-well (PW) formed on the semiconductor substrate, the source (SO) and the drain (DR) are formed by n-type impurity implantation. Also, on the P-well (PW), the memory node (MN) is formed via the tunnel insulator (TNI), and the side gate (SG) is formed via the gate insulator (GI). The side gate (SG) has a shape that covers the memory node (MN). The memory node (MN) and the side gate (SG) are insulated by the side insulator (SI) and the interlayer insulator (ILI). The memory node (MN) is insulated from the periphery thereof and put into a floating state.

The semiconductor substrate and the P-well are made of, for example, single crystal silicon, and the tunnel insulator (TNI), the interlayer insulator (ILI), the gate insulator (GI), and the side insulator (SI) are formed of, for example, silicon oxide films. Also, the memory node (MN) is made of, for example, n-type polysilicon, and the side gate (SG) is made of, for example, n-type polysilicon. The control gate (CG) is formed of, for example, a stacked structure of n-type polysilicon and tungsten.

As described above, the memory cell structure in the seventh embodiment is different from that of the above-described first embodiment in that the side gate (SG) is provided and the control gate (CG) is not provided.

Figures 23, 24:
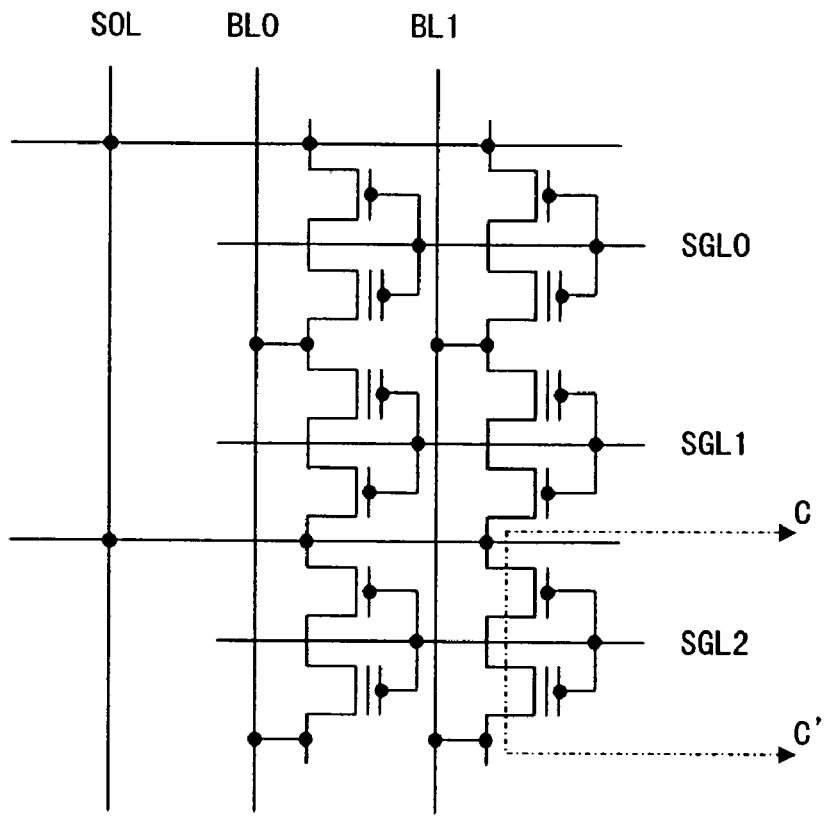
FIG. 23 is an equivalent circuit diagram showing a configuration example of a memory array included in the semiconductor device according to the seventh embodiment of the present invention.
FIG. 24 is an explanatory diagram showing an example of programming conditions in the configuration of FIG. 22 and FIG. 23.

FIG. 23 is an equivalent circuit diagram showing a configuration example of the memory array included in the semiconductor device according to the seventh embodiment of the present invention. The cross section indicated by a chain line C-C' in FIG. 23 corresponds to above-described FIG. 22.

The side gate lines (SGL) extend in the horizontal direction of the memory array. The source lines (SOL) extend in the horizontal direction of the memory array and coupled into one line at the end of the array. Further, the bit lines (BL) extend in the vertical direction of the memory array. For example, the above-described side gate (SG) also functions as the side gate line (SGL). Further, the above-described source (SO) also function as the part of the source line (SOL) extending in the horizontal direction. The part of the source lines (SOL) extending in the vertical direction and the bit lines (BL) are formed of, for example, metal wires. The bit lines are electrically coupled with the drain (DR).

As described above, the memory array configuration in the seventh embodiment is different from that of the above-described first embodiment in that the side gate lines (SGL) are provided, and no control gate line (CGL) is provided.

Next, the operation of the memory will be described.

Programming is performed by the CHE injection, in particular, by a method called source side injection (SSI). FIG. 24 is an explanatory diagram showing an example of programming conditions in the configuration of FIG. 22 and FIG. 23. In programming, as shown in FIG. 24, voltages of about Vth, 0 V, and about 10 V are applied to the side gate (SG), the source (SO), and the drain (DR) of FIG. 22, respectively. By this means, hot electrons are generated in the channel between the region below the side gate (SG) and the region below the memory node (MN) and injected into the memory node (MN). This is equivalent to applying about Vth, 0 V, and about 10 V to the selected side gate line (SGL2), the source line (SOL), and the selected bit line (BL1) of FIG. 23, respectively.

Erasing is performed by F-N tunnel ejection from the memory node (MN) to the side gate (SG). Reading is performed by detecting the Vth change of the memory cell transistor by utilizing the channel current that flows between the source (SO) and the drain (DR).

As described above, the memory operation in the seventh embodiment is different from that of the above-described first embodiment in that the hot electrons are generated in the channel between the region below the side gate (SG) and the region below the memory node (MN).

At this time, as shown in FIG. 24, in CHE programming, about 0 V is applied to the unselected side gate lines and the unselected bit lines of FIG. 23 so that programming does not occur on the unselected cells. As a result, in some of the unselected cells (unselected cells on BL1), about 10 V is applied to the drain (DR), and about 0 V is applied to the side gate (SG). Under such voltage conditions, in the pn junction between the p-type P-well (PW) and the n-type drain (DR), hot holes generated due to interband tunneling are injected into the memory node (MN) which is at a low voltage, and drain disturbance occurs.

Therefore, the seventh embodiment is characterized in that the P-well (PW) at the CHE injection is put into a floating state in order to suppress the drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

At the erasing and reading, the P-well (PW) may be put into a floating state or may be applied with a predetermined voltage. However, when the high-speed reading operation is particularly required for on-chip use or the like, the P-well (PW) in reading is desired to be at a predetermined voltage.

The semiconductor device of the seventh embodiment is the same as that of the first embodiment except for the differences described above.

Eighth Embodiment

A semiconductor device of an eighth embodiment of the present invention will be described with reference to FIG. 25 and FIG. 26. The semiconductor device of the eighth embodiment is different from that of the seventh embodiment in the memory array configuration of the nonvolatile memory included therein.

Figures 25, 26:
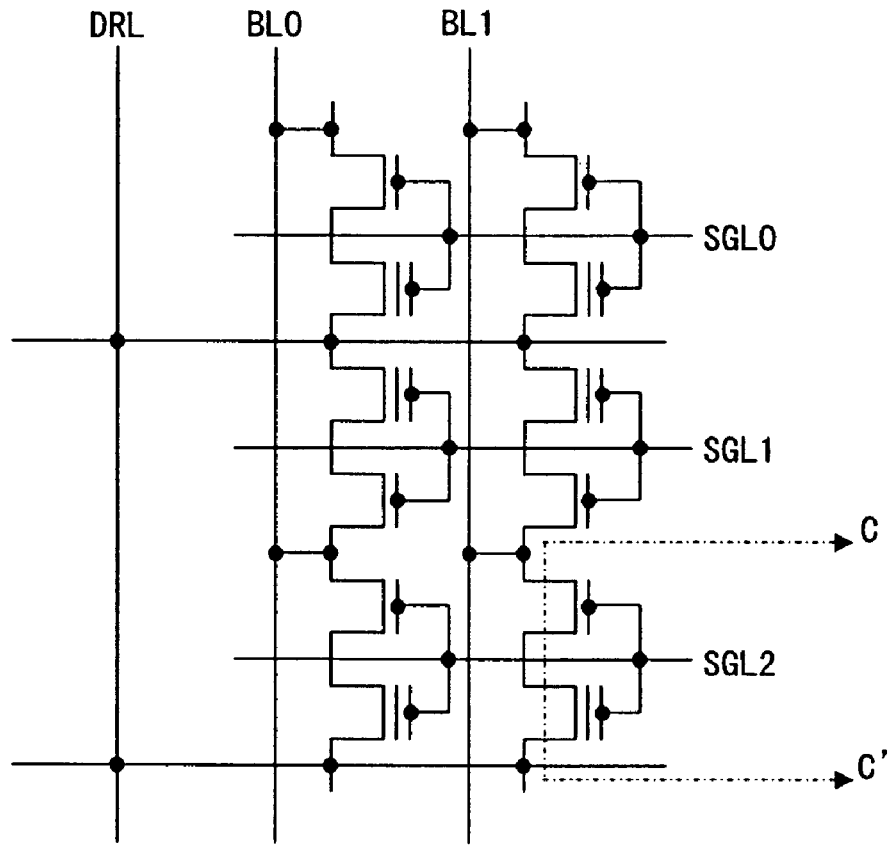
FIG. 25 is an equivalent circuit diagram showing a configuration example of a memory array included in a semiconductor device according to an eighth embodiment of the present invention.
FIG. 26 is an explanatory diagram showing an example of programming conditions in the configuration of FIG. 25.

FIG. 25 is an equivalent circuit diagram showing a configuration example of the memory array included in the semiconductor device according to the eighth embodiment of the present invention. The cross section indicated by a chain line C-C' in FIG. 25 corresponds to above-described FIG. 22. In the above-described seventh embodiment, the source lines (SOL) extend in the horizontal direction of the memory array and coupled into one line at the end of the array. In the eighth embodiment, however, the drain lines (DRL) extend in the horizontal direction of the memory array and coupled into one line at the end of the array. For example, the drain (DR) of FIG. 22 also functions as the part of the drain line (DRL) extending in the horizontal direction. The part of the drain lines (DRL) extending in the vertical direction and the bit lines (BL) are formed of, for example, metal wires. The bit line is electrically coupled with the source (SO) of FIG. 22.

Because of the differences in the array configuration, the way to apply voltages in programming also differs as shown in FIG. 24 and FIG. 26. In the seventh embodiment, about 0 V is applied to the source lines (SOL) and the unselected bit lines, and about 10 V is applied to the selected bit line. In the eighth embodiment, however, about 10 V is applied to the drain line (DRL) and the unselected bit lines, and about 0 V is applied to the selected bit line as shown in FIG. 26.

The semiconductor device of the eighth embodiment is the same as that of the seventh embodiment except for the differences described above.

The eighth embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Ninth Embodiment

A semiconductor device of a ninth embodiment of the present invention will be described with reference to FIG. 27 and FIG. 28. The semiconductor device of the ninth embodiment is different from that of the seventh embodiment in the memory array configuration of the nonvolatile memory included therein.

Figures 27, 28:
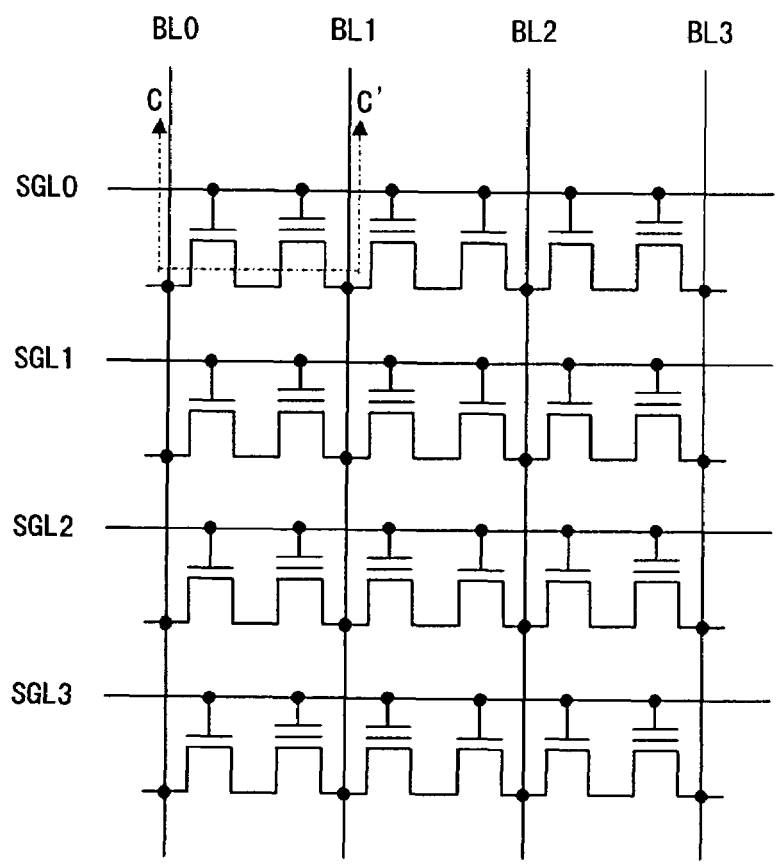
FIG. 27 is an equivalent circuit diagram showing a configuration example of a memory array included in a semiconductor device according to a ninth embodiment of the present invention.
FIG. 28 is an explanatory diagram showing an example of programming conditions in the configuration of FIG. 27.

FIG. 27 is an equivalent circuit diagram showing a configuration example of the memory array included in the semiconductor device according to the ninth embodiment of the present invention. The cross section indicated by a chain line C-C' in FIG. 27 corresponds to above-described FIG. 22. In the above-descried seventh embodiment, the source lines (SOL) extend in the horizontal direction of the memory array and are coupled into one line at the end of the array. In the ninth embodiment, however, no source line is provided. Instead of that, adjacent bit lines (BL) are used as source lines. The bit lines (BL) are formed of, for example, a diffusion layer implanted with an n-type impurity and also function as the source (SO) and the drain (DR) of FIG. 22.

Because of the differences in the array configuration, the way to apply voltages in programming also differs as shown in FIG. 24 and FIG. 28. In the above-described seventh embodiment, about 0 V is applied to the source lines (SOL) and the unselected bit lines, and about 10 V is applied to the selected bit line as shown in FIG. 24. In the ninth embodiment, however, about 10 V is applied to the selected bit line on the drain (DR) side, and about 0 V is applied to the selected bit line on the source (SO) side as shown in FIG. 28. The unselected bit lines are put into a state in which programming does not occur on the unselected cells, for example, a floating state.

The semiconductor device of the ninth embodiment is the same as that of the seventh embodiment except for the differences described above.

The ninth embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Tenth Embodiment

A semiconductor device of a tenth embodiment of the present invention will be described with reference to FIG. 29 to FIG. 32. The semiconductor device of the tenth embodiment is different from that of the first embodiment in the memory cell structure of the nonvolatile memory included therein, the configuration of the memory array, and the hot electron generation location in the CHE injection.

Figure 29:
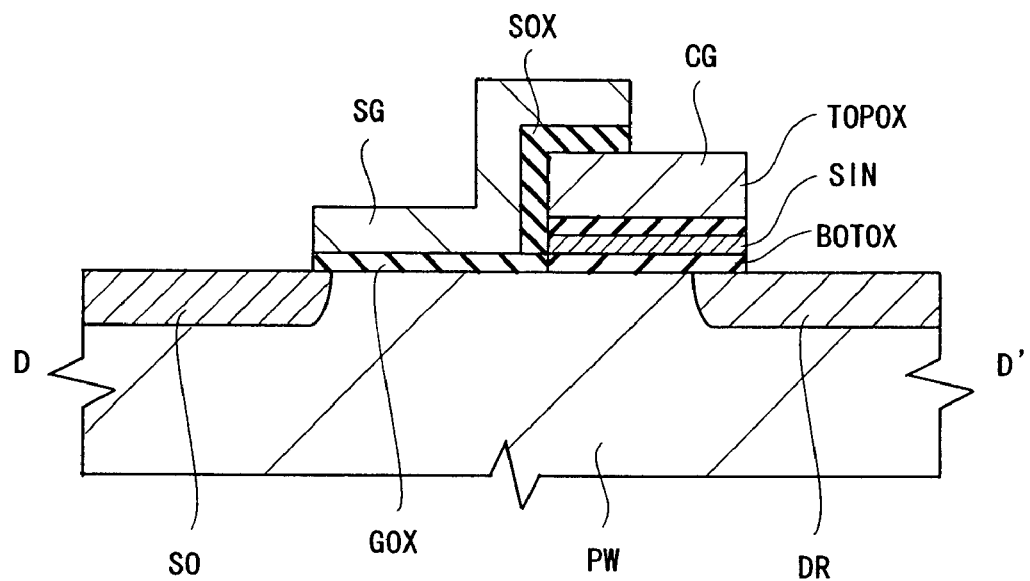
FIG. 29 is a cross sectional view showing a principal part of a structure example of each memory cell included in a semiconductor device according to a tenth embodiment of the present invention.
Figure 30:
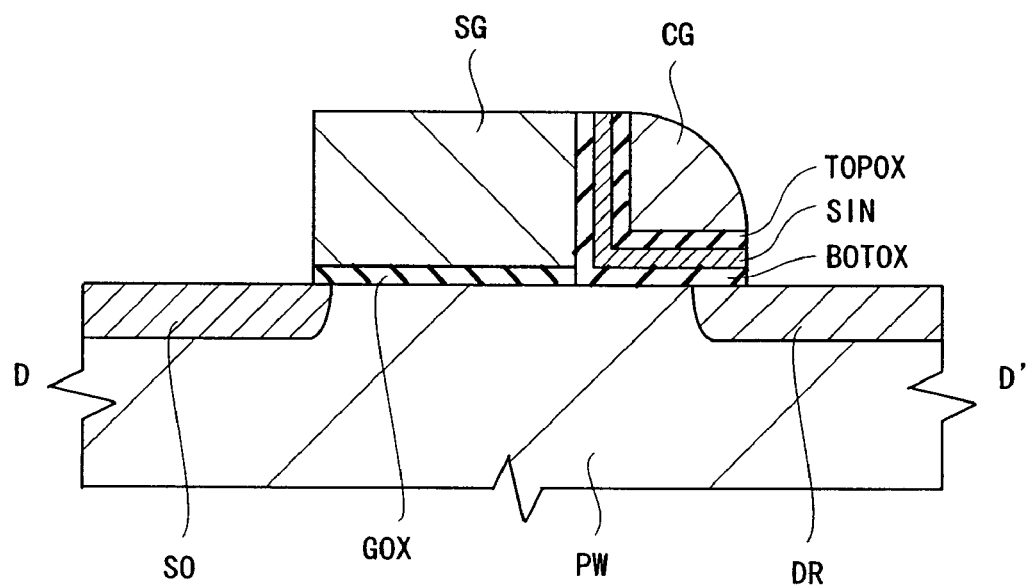
FIG. 30 is a cross sectional view showing a principal part of a structure example of each memory cell, which is different from FIG. 29, in the semiconductor device according to the tenth embodiment of the present invention.

The memory cell structure of the tenth embodiment is as shown in FIG. 29 or FIG. 30.

First, FIG. 29 will be described. FIG. 29 is a cross sectional view showing a principal part of a structure example of each memory cell included in the semiconductor device according to the tenth embodiment of the present invention. As shown in FIG. 29, in the P-well (PW) formed on the semiconductor substrate, the source (SO) and the drain (DR) are formed by n-type impurity implantation. In addition, on the P-well (PW), silicon nitride (SIN) is formed via a bottom oxide film (BOTOX), and the side gate (SG) is formed via a gate oxide film (GOX). Further, on the silicon nitride (SIN), the control gate (CG) is formed via a top oxide film (TOPOX). The side gate (SG) has a shape that covers the control gate (CG). The control gate (CG) and the side gate (SG) are insulated by a side insulator (SOX). The silicon nitride (SIN) is insulated from the periphery thereof and is put into a floating state.

The semiconductor substrate and the P-well are made of, for example, single crystal silicon, and the bottom oxide film (BOTOX), the top oxide film (TOPOX), the gate oxide film (GOX), and the side oxide film (SOX) are formed of, for example, silicon oxide films. Also, the side gate (SG) is formed of, for example, a stacked structure of n-type polysilicon and cobalt silicide, and the control gate (CG) is made of, for example, n-type polysilicon.

Next, FIG. 30 will be described. FIG. 30 is a cross sectional view showing a principal part of a structure example of each memory cell, which is different from FIG. 29, in the semiconductor device according to the tenth embodiment of the present invention. As shown in FIG. 30, in the P-well (PW) formed on the semiconductor substrate, the source (SO) and the drain (DR) are formed by n-type impurity implantation. In addition, on the P-well (PW), the silicon nitride (SIN) is formed via the bottom oxide film (BOTOX), and the side gate (SG) is formed via the gate oxide film (GOX). Further, on the silicon nitride (SIN), the control gate (CG) is formed via the top oxide film (TOPOX). The bottom oxide film (BOTOX), the silicon nitride (SIN), and the top oxide film (TOPOX) are formed between the control gate (CG) and the side gate (SG). The silicon nitride (SIN) is insulated from the periphery thereof and put into a floating state.

As described above, the memory cell structure in the tenth embodiment is different from the first embodiment in that the side gate (SG) is provided.

Figures 31, 32:
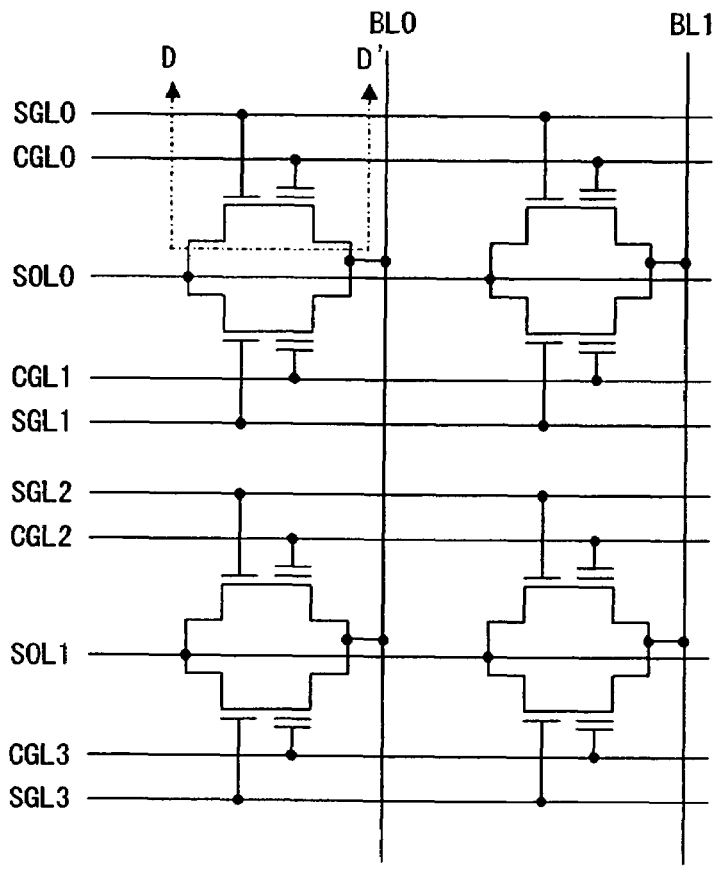
FIG. 31 is an equivalent circuit diagram showing a configuration example of a memory array included in the semiconductor device according to the tenth embodiment of the present invention.
FIG. 32 is an explanatory diagram showing an example of programming conditions in the configuration of FIG. 29 to FIG. 31.

FIG. 31 is an equivalent circuit diagram showing a configuration example of the memory array included in the semiconductor device according to the tenth embodiment of the present invention. The cross section indicated by a chain line D-D' in FIG. 31 corresponds to above-described FIG. 29 or FIG. 30.

The control gate lines (CGL) and the side gate lines (SGL) extend in the horizontal direction of the memory array. The source lines (SOL) extend in the horizontal direction of the memory array. Also, the bit lines (BL) extend in the vertical direction of the memory array. The above-described side gate (SG) also functions as the side gate line (SGL). Further, the above-described source (SO) also functions as the source line (SOL). The bit line (BL) is formed of, for example, a metal wire and electrically coupled with the drain (DR).

As described above, the memory array configuration in the tenth embodiment is different from that of the above-described first embodiment in that the side gate lines (SGL) are provided.

Next, the operation of the memory will be described.

Programming is performed by the CHE injection, in particular, by a method called source side injection (SSI). FIG. 32 is an explanatory diagram showing an example of programming conditions in the configurations of FIG. 29 to FIG. 31. In programming, as shown in FIG. 32, voltages of about 10 V, about Vth, 0 V, and about 5 V are applied to the control gate (CG), the side gate (SG), the source (SO) and the drain (DR) of FIG. 29 or FIG. 30, respectively. By this means, hot electrons are generated in the channel between the region below the side gate (SG) and the region below the silicon nitride (SIN) and injected into the silicon nitride (SIN). This is equivalent to applying about 10 V, about Vth, 0 V, and about 5 V to a selected control gate line (CGL0), a selected side gate line (SGL0), a selected source line (SOL0), and a selected bit line (BL0) of FIG. 31, respectively.

Erasing is performed by F-N tunnel ejection from the silicon nitride (SIN) to the control gate (CG), the side gate (SG), or the P-well (PW) or by injecting hot holes generated by interband tunneling in the pn junction between the P-well (PW) and the drain (DR) into the silicon nitride (SIN) (same principle as drain disturbance). Reading is performed by detecting the Vth change of the memory cell transistor by utilizing the channel current that flows between the source (SO) and the drain (DR).

As described above, the memory operation in the tenth embodiment is different from that of the above-described first embodiment in that the hot electrons are generated in the channel between the region below the side gate (SG) and the region below the silicon nitride (SIN).

At this time, as shown in FIG. 32, in CHE programming, about 0 V is applied to the unselected control gate lines, the unselected side gate lines, and the unselected bit lines of FIG. 31 so that programming does not occur on the unselected cells. As a result, in some of the unselected cells (unselected cells on BL1), about 5 V is applied to the drain (DR), and about 0 V is applied to the control gate (CG). Under such voltage conditions, in the pn junction between the p-type P-well (PW) and the n-type drain (DR), the hot holes generated by interband tunneling are injected into the memory node (MN) which is at a low voltage, and the drain disturbance occurs.

Therefore, the tenth embodiment is characterized in that the P-well (PW) at the CHE injection is put into a floating state in order to suppress the drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

At the erasing and reading, the P-well (PW) may be put into a floating state or may be applied with a predetermined voltage. However, when erasing is to be performed by injecting the hot holes generated by interband tunneling in the pn junction between the P-well (PW) and the drain (DR), the P-well (PW) in reading is desired to be at a predetermined voltage. Further, when the high-speed reading operation is particularly required for on-chip use or the like, the P-well (PW) in reading is desired to be at a predetermined voltage.

The semiconductor device of the tenth embodiment is the same as that of the first embodiment except for the differences described above.

Eleventh Embodiment

A semiconductor device of an eleventh embodiment of the present invention will be described with reference to FIG. 33 and FIG. 34. The semiconductor device of the eleventh embodiment is different from that of the tenth embodiment in the memory array configuration of the nonvolatile memory included therein.

Figures 33, 34:
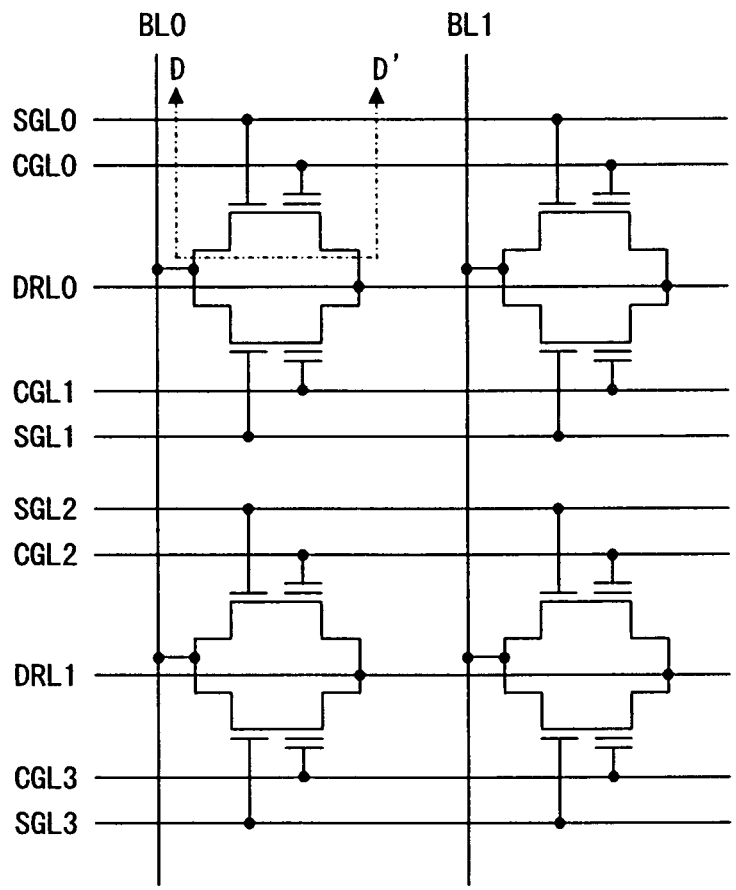
FIG. 33 is an equivalent circuit diagram showing a configuration example of a memory array included in a semiconductor device according to an eleventh embodiment of the present invention.
FIG. 34 is an explanatory diagram showing an example of programming conditions in the configuration of FIG. 33.

FIG. 33 is an equivalent circuit diagram showing a configuration example of the memory array included in the semiconductor device according to the eleventh embodiment of the present invention. The cross section indicated by a chain line D-D' in FIG. 33 corresponds to above-described FIG. 29 or FIG. 30. In the above-described tenth embodiment, the source lines (SOL) extend in the horizontal direction of the memory array. In the eleventh embodiment, however, the drain lines (DRL) extend in the horizontal direction of the memory array. The drain (DR) of FIG. 29 or FIG. 30 also functions as the drain line (DRL). The bit lines (BL) are formed of, for example, metal wires and electrically coupled with the source (SO) of FIG. 29 or FIG. 30.

Because of the differences in the array configuration, the way to apply voltages in programming also differs as shown in FIG. 32 and FIG. 34. In the above-described tenth embodiment, about 0 V is applied to the source line (SOL) and the unselected bit line, and about 5 V is applied to the selected bit line as shown in FIG. 32. In the eleventh embodiment, however, about 5 V is applied to the drain line (DRL) and the unselected bit line, and about 0 V is applied to the selected bit line as shown in FIG. 34.

The semiconductor device of the eleventh embodiment is the same as that of the tenth embodiment except for the differences described above.

The eleventh embodiment is also characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

Twelfth Embodiment

A semiconductor device of a twelfth embodiment of the present invention will be described with reference FIG. 35 to FIG. 37. The semiconductor device of the twelfth embodiment is different from that of the first embodiment in the memory cell structure of the nonvolatile memory included therein, the configuration of the memory array, and the hot electron generation location in the CHE injection.

Figure 35:
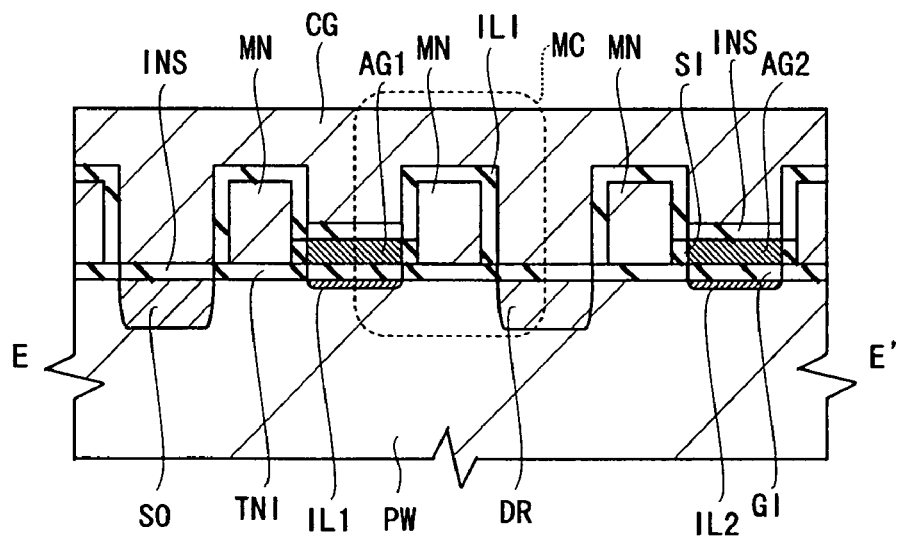
FIG. 35 is a cross sectional view showing a principal part of a structure example of each memory cell included in a semiconductor device according to a twelfth embodiment of the present invention.

FIG. 35 is a cross sectional view showing a principal part of a structure example of each memory cell included in the semiconductor device according to the twelfth embodiment of the present invention. As shown in FIG. 35, in the P-well (PW) formed on the semiconductor substrate, the source (SO) and the drain (DR) are formed by n-type impurity implantation. In addition, on the P-well (PW), the memory node (MN) is formed via the tunnel insulator (TNI), and an assist gate (AG) is formed via the gate insulator (GI). The memory node (MN) and the assist gate (AG) are insulated by the side insulator (SI). Further, on the memory node (MN), the control gate (CG) is formed via the interlayer insulator (ILI). The memory node (MN) is insulated from the periphery thereof and put into a floating state. An inversion layer (IL) is formed below the assist gate (AG) in the reading operation.

The semiconductor substrate and the P-well are made of, for example, single crystal silicon, and the tunnel insulator (TNI), the interlayer insulator (ILI), the gate insulator (GI), and the side insulator (SI) are formed of, for example, silicon oxide films. Further, the memory node (MN) is made of, for example, n-type polysilicon, silicon fine particles, silicon nitride or the like, and the assist gate (AG) is made of, for example, n-type polysilicon. The control gate (CG) is formed of, for example, a stacked structure of n-type polysilicon and tungsten.

As described above, the memory cell structure in the twelfth embodiment is different from that of the above-described first embodiment in that two memory nodes (MN) are provided between the source (SO) and the drain (DR) and the assist gate (AG) is provided.

Figure 36:
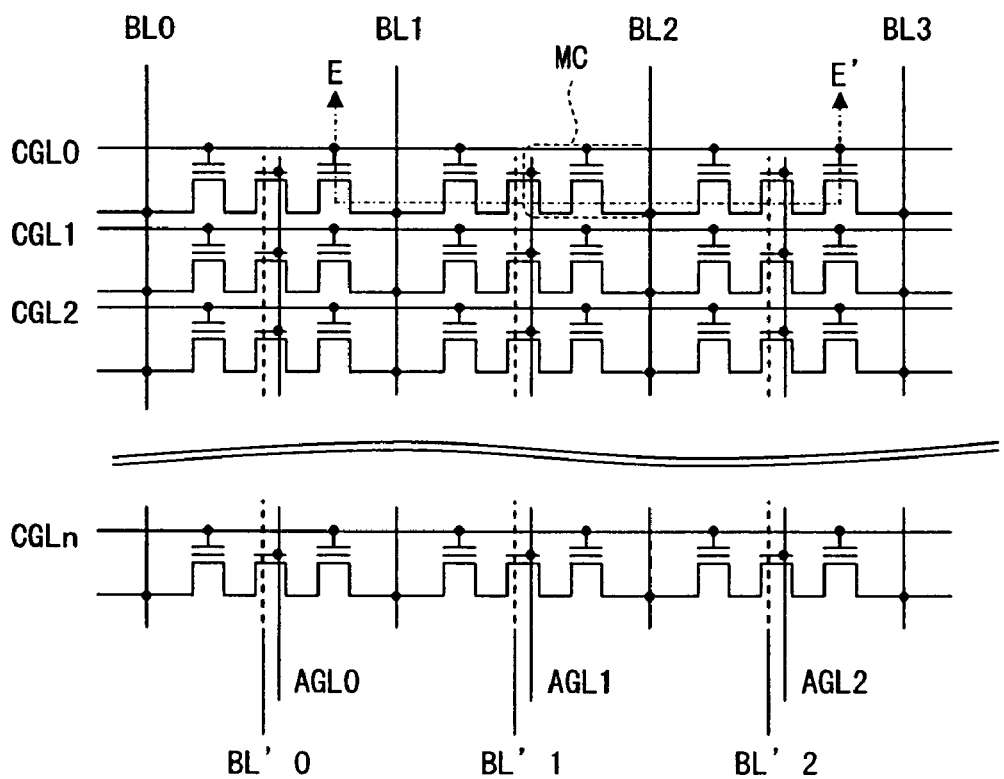
FIG. 36 is an equivalent circuit diagram showing a configuration example of a memory array included in the semiconductor device according to the twelfth embodiment of the present invention.

FIG. 36 is an equivalent circuit diagram showing a configuration example of the memory array included in the semiconductor device according to the twelfth embodiment of the present invention. The cross section indicated by a chain line E-E' in FIG. 36 corresponds to above-described FIG. 35.

The control gate lines (CGL) extend in the horizontal direction of the memory array. The assist gate lines (AGL) and the bit lines (BL, BL') extend in the vertical direction of the memory array. The above-described control gate (CG) also functions as the control gate line (CGL). Further, the above-described source (SO) or the drain (DR) also functions as the bit line (BL). The above-described inversion layer (IL) also functions as the part of the broken lines of the bit lines (BL').

As described above, the memory array configuration in the twelfth embodiment is different from that of the first present embodiment in that the assist gate lines (AGL) are provided between the bit lines (BL).

Next, the operation of the memory will be described.

Programming is performed by the CHE injection, in particular, by a method called source side injection (SSI). FIG. 37 is an explanatory drawing showing an example of programming conditions in the configuration of FIG. 35 and FIG. 36. In programming, as shown in FIG. 37, voltages of about 15 V, about Vth, 0 V, and about 5 V are applied to the control gate (CG), the assist gate (AG), the source (SO), and the drain (DR) of FIG. 35, respectively. By this means, hot electrons are generated in the channel between the region below the assist gate (AG) and the regions below the memory nodes (MN) and injected into the memory node (MN) that is close to the drain (DR). This is equivalent to applying about 15 V, about Vth, 0 V, and about 5 V to the selected control gate line (CGL0), the selected assist gate line (AGL1), the selected bit line (BL1) on the source side, and the selected bit line (BL2) on the drain side of FIG. 36, respectively.

Erasing is performed by F-N tunnel ejection from the memory node (MN) to the control gate (CG), the assist gate (AG), or the P-well (PW) or by hot hole injection into the memory node (MN). Reading is performed by detecting the Vth change of the memory cell transistor by utilizing a channel current that flows between the inversion layer (IL) (bit line (BL') of FIG. 36), which is formed by applying about 3 V to the assist gate (AG) of FIG. 35, and the drain (DR) or the source (SO) (bit line (BL) of FIG. 36).

As described above, the memory operation in the twelfth embodiment is different from that of the first embodiment in that the hot electrons are generated in the channel between the region below the assist gate (AG) and the regions below the memory nodes (MN).

At this time, as shown in FIG. 37, in CHE programming, about 0 V is applied to the unselected control gate lines, the unselected assist gate lines, and the unselected bit lines of FIG. 36 so that programming does not occur on the unselected cells. As a result, in some of the unselected cells (unselected cells on BL2), about 5 V is applied to the drain (DR), and about 0 V is applied to the control gate (CG). Under such voltage conditions, the hot holes which are generated due to interband tunneling in the pn junction between the p-type P-well (PW) and the n-type drain (DR) are injected into the memory node (MN) which is at a low voltage, and drain disturbance occurs.

The twelfth embodiment is characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

At the erasing and reading, the P-well (PW) may be put into a floating state or may be applied with a predetermined voltage. However, when the reduction of bit cost is particularly required for high-density data recording or the like, it is desired that the P-well (PW) is put into a floating state also at the erasing and reading, and the contacts (CONT) in the periphery of the P-wells (PW) and the PW voltage control circuit are omitted.

The semiconductor device of the twelfth embodiment is the same as that of the first embodiment except for the differences described above.

Thirteenth Embodiment

A semiconductor device of a thirteenth embodiment of the present invention will be described with reference to FIG. 38 to FIG. 40. The semiconductor device of the thirteenth embodiment is different from that of the first embodiment in the memory cell structure of the nonvolatile memory included therein, the configuration of the memory array, and the hot electron generation location in the CHE injection.

FIG. 38 is a cross sectional view showing a principal part of a structure example of each memory cell included in the semiconductor device according to the thirteenth embodiment of the present invention. As shown in FIG. 38, in the P-well (PW) formed on the semiconductor substrate, the source (SO) and the drain (DR) are formed by n-type impurity implantation. In addition, on the P-well (PW), the memory node (MN) is formed via the tunnel insulator (TNI), and the side gate (SG) is formed via the gate insulator (GI). The memory node (MN) and the side gate (SG) are insulated by the side insulator (SI). Further, on the memory node (MN), the control gate (CG) is formed via the interlayer insulator (ILI). The memory node (MN) is insulated from the periphery thereof and is put into a floating state.

The semiconductor substrate and the P-well are made of, for example, single crystal silicon, and the tunnel insulator (TNI), the interlayer insulator (ILI), the gate insulator (GI), and the side insulator (SI) are formed of, for example, silicon oxide films. Also, the memory node (MN) is made of, for example, n-type polysilicon, silicon fine particles, silicon nitride, or the like, and the side gate (SG) is made of, for example, n-type polysilicon. The control gate (CG) is formed of, for example, a stacked structure of n-type polysilicon and tungsten.

As described above, the memory cell structure in the thirteenth embodiment is different from that of the first embodiment in that two memory nodes (MN) and the side gate (SG) are provided between the source (SO) and the drain (DR).

FIG. 39 is an equivalent circuit diagram showing a configuration example of the memory array included in the semiconductor device according to the thirteenth embodiment of the present invention. The cross section indicated by a chain line F-F' in FIG. 39 corresponds to above-described FIG. 38.

The control gate lines (CGL) extend in the horizontal directions of the memory array. The side gate lines (SGL) and the bit lines (BL) extend in the vertical direction of the memory array. For example, the above-described control gate (CG) also functions as the control gate line (CGL). Further, for example, the above-described source (SO) or the drain (DR) also functions as the bit line (BL).

As described above, the memory array configuration in the thirteenth embodiment is different from that of the first embodiment in that the side gate lines (SGL) are provided between the bit lines (BL).

Next, the operation of the memory will be described.

Programming is performed by the CHE injection, in particular, by a method called source side injection (SSI). FIG. 40 is an explanatory diagram showing an example of programming conditions in the configuration of FIG. 38 and FIG. 39. In programming, as shown in FIG. 40, voltages of about 15 V, about Vth, 0 V, and about 5 V are applied to the control gate (CG), the side gate (SG), the source (SO), and the drain (DR) of FIG. 38, respectively. By this means, hot electrons are generated in the channel between the region below the side gate (SG) and the region below the memory node (MN) and injected into the memory node (MN) that is close to the drain (DR). This is equivalent to applying about 15 V, about Vth, 0 V, and about 5 V to the selected control gate line (CGL0), the selected side gate line (SGL1), the selected bit line (BL1) on the source side, and the selected bit line (BL2) on the drain side of FIG. 39, respectively.

Erasing is performed by F-N tunnel ejection from the memory node (MN) to the control gate (CG), the side gate (SG), or the P-well (PW) or by hot hole injection into the memory node (MN). Reading is performed by detecting the Vth change of the memory cell transistor by utilizing the channel current flowing between the source (SO) and the drain (DR).

As described above, the memory operation in the thirteenth embodiment is different from that of the first embodiment in that the hot electrons are generated in the channel between the region below the side gate (SG) and the region below the memory node (MN).

At this time, as shown in FIG. 40, in CHE programming, about 0 V is applied to the unselected control gate lines, the unselected side gate lines, and the unselected bit lines of FIG. 39 so that programming does not occur on the unselected cells. As a result, in some of the unselected cells (unselected cells on BL2), about 5 V is applied to the drain (DR), and about 0 V is applied to the control gate (CG). Under such voltage conditions, the hot holes generated due to interband tunneling in the pn junction between the p-type P-well (PW) and the n-type drain (DR) are injected into the memory node (MN) which is at a low voltage, and drain disturbance occurs.

The thirteenth embodiment is characterized in that the P-well (PW) at the CHE injection is put into a floating state in order to suppress drain disturbance. The generation of hot holes due to interband tunneling is largely dependent on the voltage between the P-well (PW) and the drain (DR), and the larger the voltage is, the more readily hot holes are generated. When the P-well (PW) is put into a floating state, by virtue of a transient current that flows from the drain (DR) or capacity coupling with the drain (DR), the P-well voltage (VPW) at the CHE injection is balanced in a positive state. In other words, the voltage between the P-well (PW) and the drain (DR) is reduced, and generation of hot holes in the unselected cells is reduced. Therefore, the lifetime until data destruction occurs due to drain disturbance is extended.

At the erasing and reading, the P-well (PW) may be put into a floating state or may be applied with a predetermined voltage. However, when the reduction of bit cost is particularly required for high-density data recording or the like, it is desired that the P-well (PW) is put into a floating state also at the erasing and reading, and the contacts (CONT) in the periphery of the P-wells (PW) and the PW voltage control circuit are omitted.

The semiconductor device of the thirteenth embodiment is the same as that of the first embodiment except for the differences described above.

Effects of the present invention will be described with reference to FIG. 41. FIG. 41 shows data acquired by using the semiconductor device according to the eleventh embodiment of the present invention and measurement results of electron-injection-type drain disturbance applied to the cell selected by CGL0 and BL1 and hole-injection-type drain disturbance applied to the cell selected by CG1 and BL1, when programming is performed on the cell selected by CGL0 and BL0.

When programming is performed on the cell selected by CGL0 and BL0, about 10 V is applied to CG0 and about 5 V is applied to DRL0. Therefore, the hot electrons generated by interband tunneling in the pn junction between the p-type P-well (PW) and the n-type drain (DR) are injected into the memory node (MN) which is made of silicon nitride (SIN) and is at a high voltage, and data destruction occurs.

As shown in FIG. 41, compared with the case where 0 V is applied to the p-type P-well (PW), increase in Vth due to electron injection is slower and disturbance endurance characteristics are higher in the case where it is put into a floating state.

Further, when programming is performed on the cell selected by CGL0 and BL0, a low voltage is applied to CGL1, and a voltage of about 5 V is applied to DRL0. Therefore, the hot holes generated by interband tunneling in the pn junction between the p-type P-well (PW) and the n-type drain (DR) are injected into the memory node (MN) which is at a low voltage and made of silicon nitride (SIN), and data destruction occurs.

As shown in FIG. 41, compared with the case where 0 V is applied to the p-type P-well (PW), decrease in Vth due to hole injection is slower and disturbance endurance characteristics are higher in the case where it is put into a floating state.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor device of the present invention is particularly suitable when applied to semiconductor products for personal digital assistants such as portable personal computers and digital still cameras and is widely applicable to semiconductor products including nonvolatile memories such as flash memories.

What is claimed is:

1. A semiconductor device comprising:
    a first source region, a second source region, and a first drain region which exhibit a second conductivity type and are formed in a semiconductor well of a first conductivity type;
    a first memory node which is formed on the semiconductor well between the first source region and the first drain region via a first insulator and is insulated from its periphery;
    a second memory node which is formed on the semiconductor well between the first drain region or a second drain region electrically connected to the first drain region and the second source region via a second insulator and is insulated from its periphery;
    a first electrode formed on the first memory node via a third insulator; and
    a second electrode formed on the second memory node via a fourth insulator,
    wherein, in a programming operation to the first memory node,
    (a) a first voltage is applied to the first electrode, thereby putting a channel at lower portion of the first memory node into a low resistance state,
    (b) a second voltage is applied to the second electrode, thereby putting a channel at lower portion of the second memory node into a high resistance state, and
    (c) a current is allowed to flow between the first source region and the first drain region below the first memory node, thereby injecting generated hot carries into the first memory node, and
    wherein the semiconductor well is put into an electrically floating state in the programming operation.

2. The semiconductor device according to claim 1, further comprising:
    a voltage control circuit which can put the semiconductor well into an electrically floating state in the programming operation and can put the semiconductor well into a floating state or apply a predetermined voltage thereto in an erasing or reading operation; and
    wirings and contacts for electrically connecting the semiconductor well to the voltage control circuit.

3. The semiconductor device according to claim 1,
    wherein contacts and a voltage control circuit for supplying a predetermined voltage to the semiconductor well are not provided, and
    wherein the semiconductor well is put into an electrically floating state in any of operations of programming, erasing, and reading.

4. The semiconductor device according to claim 1, further comprising:
    a third electrode which is formed on the semiconductor well between the first source region and the first drain region via a fifth insulator and is adjacent to the first memory node via a sixth insulator,
    wherein a channel at lower portion of the third electrode is put into an intermediate resistance state by applying a third voltage to the third electrode in a programming operation to the first memory node.

5. The semiconductor device according to claim 4, further comprising:
    a third memory node which is formed on the semiconductor well between the first source region and the first drain region via a seventh insulator and is adjacent to the third electrode via an eighth insulator.

6. A semiconductor device comprising:
    a plurality of source regions and a plurality of drain regions which are formed in a semiconductor well of a first conductivity type and are second conductivity type regions;
    a first memory node formed on the semiconductor well between the source region and the drain region, which are mutually adjacent among the plurality of source regions and the plurality of drain regions, via a first insulator;
    a first electrode formed on the first memory node via a second insulator;
    a second electrode which is formed on the semiconductor well between the mutually adjacent source region and drain region via a third insulator and is disposed adjacent to the first memory node via a fourth insulator;
    a first wiring commonly connected to a part of the plurality of source regions; and
    a second wiring commonly connected to a part of the plurality of drain regions,
    wherein, when a programming operation in which hot carries which are generated by applying a voltage difference between the first wiring and the second wiring are accumulated in the first memory node is to be performed, the semiconductor well is put into an electrically floating state.

7. The semiconductor device according to claim 6, further comprising:
    a voltage control circuit which can put the semiconductor well into an electrically floating state in the programming operation and can put the semiconductor well into a floating state or apply a predetermined voltage thereto in an erasing or reading operation; and wirings and contacts for electrically connecting the semiconductor well to the voltage control circuit.

8. The semiconductor device according to claim 6,
wherein contacts and a voltage control circuit for supplying a predetermined voltage to the semiconductor well are not provided, and
wherein the semiconductor well is put into an electrically floating state in any of operations of programming, erasing, and reading.

9. A semiconductor device comprising:
a plurality of source regions and a plurality of drain regions which are formed in a semiconductor well of a first conductivity type and are second conductivity type regions;
a first memory node formed on the semiconductor well between the source region and the drain region, which are mutually adjacent among the plurality of source regions and the plurality of drain regions, via a first insulator;
a second memory node formed on the semiconductor well between the mutually adjacent source region and drain region via a second insulator;
a first electrode which is formed on the semiconductor well between the mutually adjacent source region and drain region via a third insulator, is disposed adjacent to the first memory node via a fourth insulator, and is disposed adjacent to the second memory node via a fifth insulator;
a second electrode formed over the first memory node, the second memory node, and the first electrode via a sixth insulator;
a first wiring commonly connected to a part of the plurality of source regions; and
a second wiring commonly connected to a part of the plurality of drain regions,
wherein, when a programming operation in which hot carries which are generated by applying a voltage difference between the first wiring and the second wiring are accumulated in the first memory node or the second memory node is to be performed, the semiconductor well is put into an electrically floating state.

10. The semiconductor device according to claim 9, further comprising:
a voltage control circuit which can put the semiconductor well into an electrically floating state in the programming operation and can put the semiconductor well into a floating state or apply a predetermined voltage thereto in an erasing or reading operation; and
wirings and contacts for electrically connecting the semiconductor well to the voltage control circuit.

11. The semiconductor device according to claim 9,
wherein contacts and a voltage control circuit for supplying a predetermined voltage to the semiconductor well are not provided, and
wherein the semiconductor well is put into an electrically floating state in any of operations of programming, erasing, and reading.

* * * * *